US012417803B2

(12) United States Patent
Chun et al.

(10) Patent No.: US 12,417,803 B2
(45) Date of Patent: Sep. 16, 2025

(54) NEURAL NETWORK BASED METHOD AND DEVICE

(71) Applicants: SAMSUNG ELECTRONICS CO., LTD., Suwon-si (KR); Research & Business Foundation SUNGKYUNKWAN UNIVERSITY, Suwon-si (KR)

(72) Inventors: Jung Hoon Chun, Suwon-si (KR); Ji Ho Song, Seoul (KR); Yoonmyung Lee, Suwon-si (KR); Ju A Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 225 days.

(21) Appl. No.: 17/883,546

(22) Filed: Aug. 8, 2022

(65) Prior Publication Data

US 2023/0298663 A1   Sep. 21, 2023

(30) Foreign Application Priority Data

Mar. 18, 2022   (KR) ........................ 10-2022-0033964

(51) Int. Cl.
*G11C 11/50*    (2006.01)
*G06N 3/06*     (2006.01)
(Continued)

(52) U.S. Cl.
CPC .............. *G11C 11/54* (2013.01); *G06N 3/061* (2013.01); *G11C 13/004* (2013.01)

(58) Field of Classification Search
CPC ... G11C 11/54; G11C 13/004; G11C 11/1673; G11C 11/16; G11C 13/0002;
(Continued)

(56) References Cited

U.S. PATENT DOCUMENTS 5,625,752 A * 4/1997 Swenson ................ G06N 3/063
706/39
8,274,819 B2   9/2012 Yang
(Continued)

FOREIGN PATENT DOCUMENTS

CN        112786081 A    5/2021
JP    WO2009/060783 A1   5/2009
(Continued)

OTHER PUBLICATIONS

International Search Report issued on Jun. 23, 2023, in counterpart International Patent Application No. PCT/KR2023/003616 (3 pages).
(Continued)

*Primary Examiner* — Uyen Smet
(74) *Attorney, Agent, or Firm* — NSIP Law

(57) ABSTRACT

A neural network method and device are included, A neural network circuit includes a synaptic memory cell including a resistive memory element, which is disposed along an output line and which can have a first resistance value and a second resistance value as a resistance value, the synaptic memory cell generates a column signal, based on the resistance value of the resistive memory element and an input signal received via an input line, a reference memory cell including a reference memory element, which is disposed along a reference line and which has a resistance value that is a ratio of the first and second resistance values, the reference memory cell generates a reference signal, based on the resistance value of the reference memory element and the input signal, and an output circuit generates an output signal for the output line based on the column signal and the reference signal.

35 Claims, 12 Drawing Sheets

(51) Int. Cl.
*G11C 11/54* (2006.01)
*G11C 13/00* (2006.01)

(58) Field of Classification Search
CPC ........ G06N 3/061; G06N 3/049; G06N 3/065; G06N 3/063; G06F 7/5443; G06F 9/3893
See application file for complete search history.

(56) References Cited

U.S. PATENT DOCUMENTS

| | | |
|---|---|---|
| 8,493,776 B1 | 7/2013 | Yu et al. |
| 8,902,641 B2 | 12/2014 | Chih et al. |
| 9,111,622 B2 | 8/2015 | Subramanian et al. |
| 9,401,195 B2 | 7/2016 | Andre et al. |
| 11,031,059 B2 | 6/2021 | Petti et al. |
| 2016/0350647 A1 | 12/2016 | Hosokawa et al. |
| 2020/0160160 A1 | 5/2020 | Kim et al. |
| 2020/0334015 A1* | 10/2020 | Shibata ............ G06F 7/50 |
| 2020/0411091 A1 | 12/2020 | Hwang |
| 2021/0117499 A1* | 4/2021 | Qin ............ G11C 11/1657 |
| 2021/0166110 A1 | 6/2021 | Song |
| 2022/0028444 A1* | 1/2022 | Papageorgiou ......... G06N 3/08 |
| 2022/0270692 A1* | 8/2022 | Khwa ............ G11C 17/18 |

FOREIGN PATENT DOCUMENTS

| | | |
|---|---|---|
| KR | 10-2003-0083557 A | 10/2003 |
| KR | 10-0457264 B1 | 11/2004 |
| KR | 10-2012-0091583 A | 8/2012 |
| KR | 10-1452040 B1 | 10/2014 |
| KR | 10-2023-0090758 A | 6/2023 |
| WO | WO 2019/108458 A1 | 6/2019 |

OTHER PUBLICATIONS

Kang, Dae-Hwan, et al., "Emulation of spike-timing dependent plasticity in nano-scale phase change memory", Neurocomputing, 155, Jan. 6, 2015, (6 pages in English).

Extended European Search Report Issued on Jul. 23, 2025, in Counterpart European Patent Application No. 23771147.8 (14 Pages in English).

* cited by examiner

NEURAL NETWORK BASED METHOD AND DEVICE

CROSS-REFERENCE TO RELATED APPLICATIONS

This application claims the benefit under 35 USC § 119(a) of Korean Patent Application No. 10-2022-0033964, filed on Mar. 18, 2022, in the Korean Intellectual Property Office, the entire disclosure of which is incorporated herein by reference for all purposes.

BACKGROUND

1. Field

The following description relates to a neural network method and device.

2. Description of Related Art

In the current von Neumann computer architecture, frequent movement of large amounts of data between a processor and a memory causes long delays and large power consumption, limiting chip performance. In machine learning applications, movement of data, for example between layers of a neural network, may be the predominant aspect of computational load. In view of the cost of computation when machine learning is implemented on a von Neumann architecture, for current software-based deep neural network operations, artificial intelligence (AI) accelerator hardware may be used. Such acceleration hardware may be, for example, a high-performance central processing unit (CPU), a graphics processing unit (GPU), or an application-specific integrated circuit (ASIC).

As another example, a neuromorphic architecture may be used. A neuromorphic architecture may perform operations directly at a location of a memory device in which data is stored and may store and update a connection strength (e.g., a synaptic weight) between neuron circuits in the memory device. A neuromorphic operation method may be applied to AI, big data, a sensor network, pattern/object recognition, and the like. The neuromorphic architecture may be implemented as hardware using an analog memory.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a neural network circuit includes a synaptic memory cell including a resistive memory element, which is disposed along an output line and which is configured to vary between having a first resistance value and a second resistance value as a resistance value, wherein the synaptic memory cell is configured to generate a column signal, based on the resistance value of the resistive memory element and an input signal received via an input line, a reference memory cell including a reference memory element, which is disposed along a reference line and which has a resistance value that is a predetermined ratio of the first resistance value and the second resistance value, wherein the reference memory cell is configured to generate a reference signal, based on the resistance value of the reference memory element and the input signal, and an output circuit configured to generate an output signal for the output line based on the column signal and the reference signal.

The synaptic memory cell may include a number of resistive memory elements corresponding to a number of bits for expressing a synaptic weight assigned to the synaptic memory cell, wherein the number of resistive memory elements corresponding to the number of bits may be disposed along the input line.

The reference memory cell may include a number of reference memory elements corresponding to the number of bits for expressing the synaptic weight, wherein the reference memory elements corresponding to the number of bits may be disposed along the input line.

The reference memory cell may include reference memory elements for expressing a sign bit.

The output circuit may be further may be configured to generate, as the output signal, a current corresponding to a positive integer multiple of a net current, which may be a difference between a first current based on a resistive memory element having the first resistance value and a second current based on a resistive memory element having the second resistance value.

The output circuit may be further may be configured to generate, as the output signal, a current corresponding to a negative integer multiple of a net current, which may be a difference between a first current based on a resistive memory element having the first resistance value and a second current based on a resistive memory element having the second resistance value.

The neural network circuit may include a neuron circuit may further include the synaptic memory cell, the reference memory cell, and the output circuit, and wherein the output circuit further may include a leaky integrate-and-fire (LIF) circuit may be configured to perform firing at another neuron circuit, based on a result of comparing the output signal with a threshold.

The LIF circuit may be further may be configured to increase an output voltage when the output signal corresponds to a positive integer multiple of a net current.

The LIF circuit may be further configured to decrease an output voltage when the output signal corresponds to a negative integer multiple of a net current.

The LIF circuit may be further configured to leak the output signal from a capacitor when a voltage integrated based on the output signal does not reach a threshold voltage within a threshold time.

The LIF circuit may be further may be configured to perform firing at the other neuron circuit when a voltage integrated based on the output signal reaches a threshold voltage within a threshold time corresponding to the threshold.

The output circuit may be further configured to set a threshold time corresponding to the threshold, based on a signal generated based on a threshold memory cell and a signal generated based on the additional reference memory cell.

The output circuit may be further configured to initiate an integration of a current corresponding to a difference between the signal generated based on the threshold memory cell and the signal generated based on the additional reference memory cell and output a signal indicating a threshold time corresponding to the threshold, wherein the initiating may be based on a voltage corresponding to the integrated current exceeding a threshold voltage.

The output circuit may be further configured to apply, to the output signal for the output line and another output signal for another output line, a threshold time corresponding to the threshold determined based on the threshold memory cell and the additional reference memory cell.

Resistive memory elements of synaptic memory cells connected to the output line may be connected to each other in parallel.

The synaptic memory cell may include bits that may include respective resistors, wherein the reference memory cell may include bits that may further include respective resistors, and wherein the output circuit may include a readout circuit that may be configured to generate a column integrated signal by integrating the column signal for each bit of the synaptic memory cell and generate a reference integrated signal by integrating the reference signal for each bit of the reference memory cell.

The readout circuit may include a current mirror may be configured to copy the column signal for each bit of the synaptic memory cell and the reference memory cell to a current-multiple corresponding to the bit.

The output signal corresponds to a difference between the column integrated signal and the reference integrated signal.

The output circuit may further include a capacitor that may be configured to allow a current corresponding to the reference integrated signal to flow in a node and allow a current corresponding to the column integrated signal to flow out from the node such that a current corresponding to the difference between the column integrated signal and the reference integrated signal flows through the node, wherein the node may include the neural network circuit.

The neural network circuit may include a neuron circuit that may further include a synaptic memory cell, the reference memory cell, and the output circuit, and wherein the output circuit may be further configured to obtain, based on a result obtained by interpreting the output signal, a multiply-and-accumulate (MAC) value between a synaptic weight and an input signal received along the input line, and transmit a node value determined based on the obtained MAC value to another neuron circuit.

The ratio may be predetermined based on an application.

In one general aspect, an operating method of a neural network circuit includes generating a column signal, based on an input signal and a resistance value of a resistive memory element of a synaptic memory cell to which the input signal may be applied through an input line, wherein the synaptic memory cell is among one or more synaptic memory cells disposed along an output line, generating a reference signal, based on the input signal and a reference memory element, the reference memory element having a reference resistance value of a reference memory cell to which the input signal is applied, wherein the reference memory cell is among one or more reference memory cells disposed along a reference line, and generating an output signal for the output line from the column signal and the reference signal, wherein the reference resistance value is configured to be determined based on a combination of a first resistance value and a second resistance value that is different from the first resistance value.

The combination may be predetermined based on an application.

In one general aspect, a processor includes a memory array that includes rows and columns of resistive memory cells further include respective resistors, wherein each resistive memory cell of the memory array has a resistance that is programmable to vary between a first resistance and a second resistance, wherein a column of the memory array provides an integrated column current based on input signals supplied to respective resistive memory elements of the column and based on the resistances of the respective memory elements of the column, and a reference array of resistive memory cells further includes respective resistors, wherein each resistive memory cell of the reference column has a resistance that is programmable to vary between the first resistance and the second resistance, wherein the reference memory array provides an integrated reference current based on the input signals being supplied to resistive memory elements of the reference array and based on the resistances of the respective memory elements of the reference array.

The memory cells of the memory array may be configured to store respective synaptic weights and the reference array may not be configured to store synaptic weights.

The determining whether to output a firing signal may be based on a current difference between the integrated column current and the integrated reference current.

The processor may be configured to convert the current difference to a voltage and determine whether to output the firing signal by comparing the voltage to a threshold voltage.

The determining whether to output a firing signal may be further based on a current difference between the integrated current of the second reference column and the integrated current of the threshold column.

The determining whether to output a firing signal may include determining a threshold voltage based on the current difference between the integrated current of the second reference column the integrated current of the second reference column and comparing the threshold voltage to a voltage based on the current difference between the integrated current of the column of the crossbar array and the integrated current of the reference array.

The integrated column current may correspond to a linear combination of the first resistance and the second resistance as stored in the resistors of the column, and wherein the integrated current of the reference column may correspond to a linear combination of the first resistance and the second resistance as stored in the resistors of the reference array.

The processor may further include a capacitor and the processor may be configured to leak an output signal from the capacitor based on the integrated column current and the integrated reference current.

The processor may be configured to implement a spiking neural network using the memory array and the reference array.

The input signals may comprise a firing or leakage signal provided from a second memory array of resistive memory cells.

The processor may be configured to implement a leaky integrate and fire activation function that may be associated with the memory array.

Other features and aspects will be apparent from the following detailed description, the drawings, and the claims.

BRIEF DESCRIPTION OF THE DRAWINGS

Hereinafter, examples will be described in detail with reference to the accompanying drawings. When describing the examples with reference to the accompanying drawings, like reference numerals refer to like components and a repeated description related thereto will be omitted.

DETAILED DESCRIPTION

Figure 1:
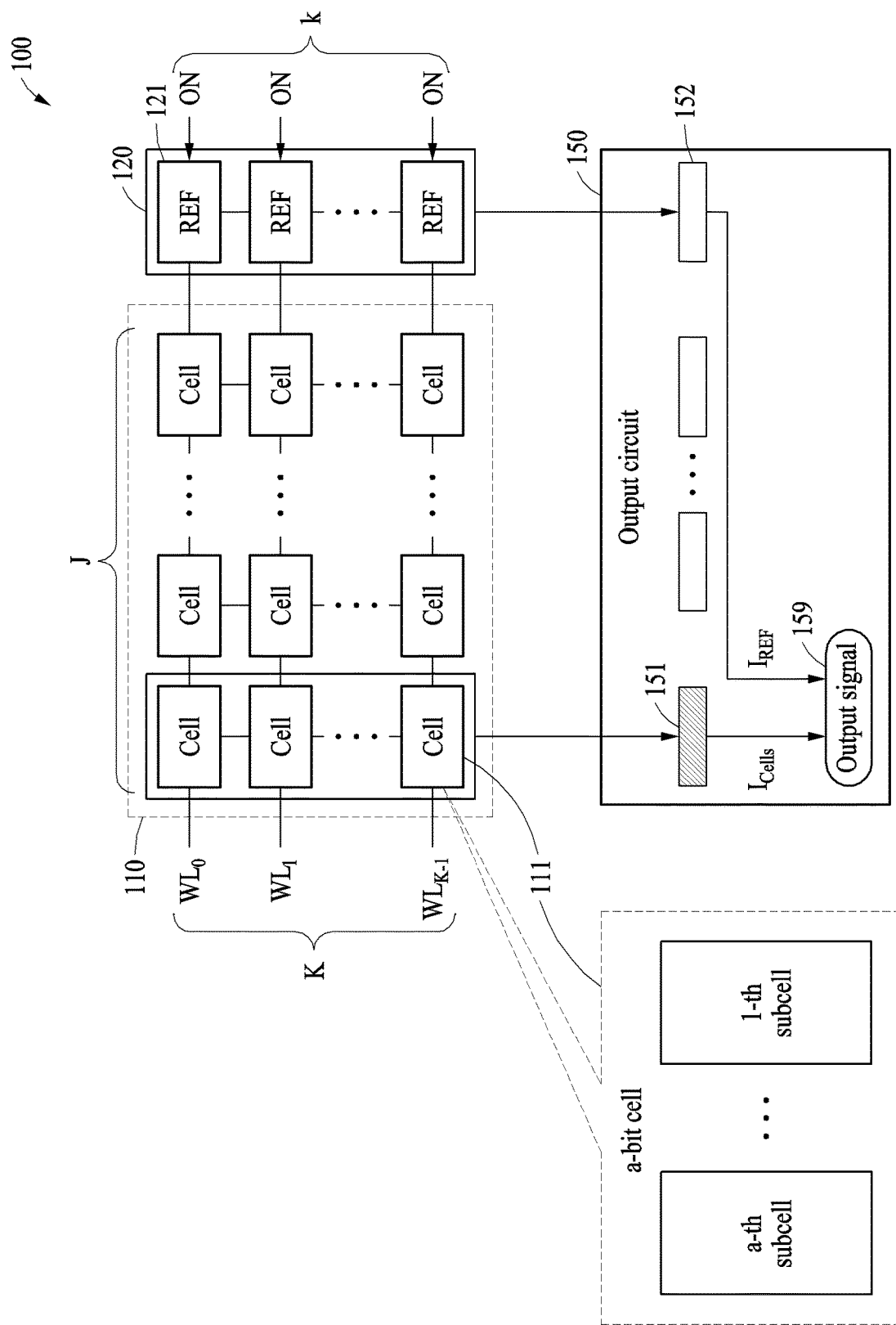
FIG. 1 illustrates an example of a neural network circuit; according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a" "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term may herein with respect to an example or embodiment, e.g., as to what an example or embodiment may include or implement, means that at least one example or embodiment exists where such a feature is included or implemented, while all examples are not limited thereto.

FIG. 1 illustrates an example of a neural network circuit, according to one or more embodiments. A neural network circuit 100 may be implemented as a circuit for simulating synapses that connect neuron circuits of a previous layer to neuron circuits of a target layer in a neural network. An electronic device including the neural network circuit 100 may also be referred to as a neural network device. A neuron circuit may include a circuit which implements activation of neurons and/or an activation function of a neural network. The neural network may include a plurality of layers each having a plurality of nodes. Relative to an arbitrary target layer in the neural network, a previous layer may be a layer connected prior to the target layer (relative to a forward pass, for example). A node of the neural network may correspond to a neuron circuit of the neural network circuit 100. The neural network circuit 100 may transmit a node value (e.g., an input value) output from a neuron circuit of the previous layer to an input of a neuron circuit of the target layer, and the node value received by the neuron circuit of the target layer may be based on a connection strength (e.g., a synaptic weight) between those two neuron circuits. A target neuron circuit of the target layer may produce, as a node output value, a result of applying an activation function to a weighted sum, where the weighted sum is based on synaptic weight values and respective node values received from respective previous neuron circuits of the previous layer connected to the target neuron circuit.

In the present specification, a neuron circuit may be implemented as an output circuit 150, and a neuron circuit of the neural network circuit 100 may implement a spiking neural network (SNN) by including a leaky integrate-and-fire (LIF) circuit. However, the examples are not limited thereto, and an activation function of the neural network may also be implemented as a circuit designed in a different manner. Herein, an activation function or a resulting activation value of an activation function, is distinguished from whether a line or operator is active or inactive, e.g., whether a line has been activated or inactivated. However, if a non-zero activation value output of a previous layer is applied to an input line, for example, the input line may be considered as being active or activated, while if a zero activation value, or no signal, is applied to a line, that line may be considered inactive or inactivated.

The neural network circuit 100 may include a synaptic memory array 110, a reference memory array 120, and the output circuit 150. The synaptic memory array 110 and the reference memory array 120 may be collectively referred to as a memory array.

The synaptic memory array 110 may include a plurality of synaptic memory cells 111 disposed along an input line and an output line. The plurality of synaptic memory cells 111 may be disposed in the form of a crossbar array. The input line may be a line for receiving an input and is illustrated as "K" word lines $WL_0$ through $WL_{K-1}$ in FIG. 1. "K" may be an integer greater than or equal to 1. The signals from the respective word lines may each represent "0" or a "1", which may be respective outputs of K nodes of a preceding layer. The output line may output an output signal 159 representing a value (e.g., a result value of multiplication and accumulation (MAC) or a weighted sum) of summing operation results (e.g., multiplication results) between synaptic weights (indicated by resistive memory elements of the synaptic memory cells 111 disposed along the output line) and input values (indicated by each of input signals). The output line is illustrated as "J" lines in FIG. 1, and "J" may be an integer greater than or equal to 1. Accordingly, the synaptic memory array 110 may include "K×J" synaptic memory cells 111. For a given synaptic memory cell 111 in the jth cell column (j is from 1 to J) and the kth cell row (k is from 1 to K), the value stored by the given synaptic memory cell 111 may be the synaptic weight between the jth node in a previous layer and the kth node in a current/next layer. In other words, the neural network circuit 100 of FIG. 1 may also be interpreted as a circuit in which a synaptic connection connecting K previous nodes to J next nodes is implemented. When a synaptic weight is expressed as "a" bits, each output line may include "a" bit lines. In this case, "a" may be an integer greater than or equal to 1. The output signal 159 output from an output line may be a difference signal between (i) a signal obtained by integrating column signals (e.g., bit column signals) generated by bit lines included in the output line and (ii) a signal obtained by integrating reference signals generated by a reference line.

The input line may receive an input signal through a pre-synaptic circuit. Specifically, the pre-synaptic circuit may receive an output of a previous node (e.g., a previous neuron circuit) of the neural network and transmit the output to a synaptic memory element of a current node such as that shown in FIG. 1. The pre-synaptic circuit may also be referred to as an axon circuit.

The output line may be connected to a post-synaptic circuit and may transmit, to the post-synaptic circuit, a signal corresponding to a MAC value computed between input signals and respective synaptic weights of the synaptic memory elements connected to the output line. The post-synaptic circuit may fire or transmit, to a next node (e.g., a next synaptic circuit), the output signal 159 corresponding to the MAC value between the input signals and the synaptic weights (the column of cells currently on the output line). The post-synaptic circuit may be represented as a dendrites circuit and may be implemented as an LIF circuit, an example of which is described below.

The input signal may be a signal received through an input line. In an example, if the neural network circuit 100 receives an input signal corresponding to a bit value of "1" from an input line, an input voltage may be applied to the input line. In another example, when an input signal of an input line represents a bit value of "0", the neural network circuit 100 may inactivate the input line. In other words, the neural network circuit 100 may not apply a voltage to the input line or may apply a voltage of 0 volts (V). However, an input voltage applied for each bit represented by an input signal is not limited to the foregoing example. In an example illustrated in FIG. 1, an activation value (e.g., a voltage corresponding to a bit value of "1") may be applied to "k" of the "K" input lines, and "k" may be an integer greater than 0 and less than or equal to K. In other words, fora given input, some of the input lines may be active ("1") and others may be inactive ("0").

Each of the synaptic memory cells 111 may respectively include a resistive memory element that is disposed along the output line and that has either a first resistance value or a second resistance value. The synaptic memory cell 111 may each include a number of resistive memory elements corresponding to the number of bits needed to for expressing synaptic weights assigned to the synaptic memory cells 111. The resistive memory elements of a given synaptic memory cell 111 (corresponding to the number of bits) may be disposed along a same input line of the given synaptic memory cell 111.

The synaptic memory cells 111 in a column may generate a column signal based on the corresponding resistive memory elements and the input signal, and may do so in response to receiving the input signal through the input line. The first and/or the second resistance values may be mapped to a respective binarized value. For example, the first resistance value and the second resistance value may respectively indicate a bit value of "0" or "1". For example, the first resistance value, which is a low resistance, may represent a bit value of "0", and the second resistance value, which is a high resistance, may represent a bit value of "1". However, the examples are not limited thereto, and bit values mapped to the first resistance value and the second resistance value may vary depending on a design.

When a synaptic weight is expressed as a bit sequence including multiple bits, the synaptic memory cells 111 may include respective pluralities of subcells. For example, a synaptic weight may be expressed as a bit sequence having "a" bits. For a synaptic weight of "a" bits, the synaptic memory cells 111 may respectively include "a" subcells. A first subcell may have a resistance value of a bit value corresponding to the least significant bit (LSB) digit of the bit sequence, and an "a"-th subcell may have a resistance value of a bit value corresponding to the most significant bit (MSB) digit of the bit sequence. Each of the "a" subcells of a cell may include a respective resistive memory element having a resistance value corresponding to a bit value of a bit digit among the bit digits forming a synaptic weight of the cell. The resistive memory elements included in each of the respective "a" subcells may be set to have resistance values mapped to the bit values of the corresponding bit digits. Each resistive memory element may be set to have either the first resistance value or the second resistance value. An example of the synaptic memory cells 111 being implemented as 3-bit cells is described with reference to FIG. 2.

A column signal may be a signal obtained by integrating signals provided by the synaptic memory cells 111 disposed along a corresponding column line in the synaptic memory array 110. For example, the column signal may be a signal corresponding to a MAC value between input values of input signals and bit values stored in the resistive memory elements of subcells connected to same bit lines in the column line of the synaptic memory array 110. In other words, a column signal of a bit line may be a signal corresponding to a MAC value of a bit digit represented by the bit line in an output line. As described below, the neural network circuit 100 may obtain a signal by multiplying each of column signals of bit lines included in the same output line by each of weights (hereinafter, referred to as "bit weights") corresponding to bit digits of the bit lines included therein and summing the multiplication result values. For example, a bit weight corresponding to the LSB may be ¼, a bit weight corresponding to a first bit digit from the LSB may be ½, and a bit weight corresponding to a second bit digit from the LSB may be 1. This example is designed under the assumption that the second bit digit from the LSB is the MSB and the bit weight thereof is 1. However, bit weights are not limited to the foregoing example and may vary depending on a design. For convenience of description, in the present specification, a column is mainly illustrated as a vertical line. However, the examples are not limited thereto, and a shape of a column line may vary depending on a design.

As described above, a resistive memory element may be an element that may have the first resistance value or the second resistance value. For example, the resistive memory element may be a magnetic random access memory (MRAM) element. The MRAM element may have either one of two states of a magnetic tunnel junction (MTJ). The MRAM element in a parallel (P) state may have the first resistance value, and the MRAM element in an anti-parallel (AP) state may have the second resistance value. The second resistance value may be greater than the first resistance value. The second resistance value and the first resistance value may respectively be referred to as a high resistance value and a low resistance value. The AP state and the P state may also respectively be referred to as a high resistance state and a low resistance state. A resistance ratio of the second resistance value to the first resistance value of the MRAM may be 2, for example. A resistance ratio of a resistive memory element, however, is not limited to the foregoing example and may vary depending on the type of the resistive memory element, design parameters, etc. The neural network circuit 100 may generate a net signal by using the reference memory array 120 to be described below to distinguish between signals output based on the first resistance value and the second resistance value of the resistive memory element.

For ease of description, in the present specification, resistive memory elements in a P state and an AP state are mainly described, but the examples are not limited thereto. Unless described otherwise, the P state and the AP state may be respectively interpreted as a state having the first resistance value and a state having the second resistance value.

The reference memory array 120 may include a plurality of reference memory cells 121 disposed along the reference line. The reference memory array 120 may include the same number of reference memory cells 121 as the number of input lines (input bit lines), i.e., there may be K reference memory cells 121.

The reference memory cells 121 may be disposed along the reference line and may each include a reference memory element having a programmable resistance value that may be programmed based on an application. In this case, having a 'programmable' resistance value may mean that a resistance value is variously changeable. Each reference memory cell 121 may include a number of reference memory elements corresponding to the number of bits for expressing a synaptic weight. For a given reference cell, the reference memory elements thereof (corresponding to the number of bits of a synaptic weight) may be disposed along the same input line corresponding to the given reference cell.

In an example, each of the reference memory cells 121, similar to the synaptic memory cells 111 described above, may include the same number of reference subcells as the number of bits; in other words, the same number of resistive memory elements as the number of bits. In this case, the reference memory cells 121 may include a resistive memory element set to a resistance value predetermined between the first resistance value and the second resistance value.

In another example, each of the reference memory cells 121, regardless of the number of bits of the synaptic memory cells 111, may be a 1-bit cell for storing single-bit information (e.g., a sign bit).

A given reference memory cell 121 may contribute to a reference signal of the reference memory array 120 based on a reference memory element of the given memory cell and based on the input signal. The reference signal may be a signal obtained by integrating signals output from each of the reference memory cells 121 disposed along the reference line in the reference memory array 120. The reference line may include the same number of reference bit lines as the number of bits in each of the reference cells. For example, the reference signal may be a signal corresponding to a MAC value computed between input values of input signals and bit values corresponding to resistive memory elements of reference subcells connected to the same reference bit line in the reference memory array 120 (as described further with reference to FIG. 2). In other words, a reference signal of a reference bit line may be a signal corresponding to a MAC value of bit digits represented by the reference bit lines in a reference line.

The output circuit 150 may generate the output signal 159 for the output line from the column signal and the reference signal. For reference, the neural network circuit 100 may further include other synaptic memory cells disposed along another output line (e.g., another column of the synaptic memory array 110). In this case, the output circuit 150 may individually generate respective output signals for the output line and for the other output line by using the same reference memory cells. In other words, the output circuit 150 may use the same reference column signal to generate different output signals for each output line, respectively. An operation of the output circuit 150 is described below.

The neural network circuit 100, while performing a synaptic operation (e.g., generating J 0/1 output signals in response to K 0/1 input signals from K previous nodes), may integrate all signals (e.g., current signals) generated for each column when an input (of "1") is provided to "K" word lines for accessing each synaptic memory element. Each output line may include respective bit lines respectively corresponding to bit digits, and a column integrated signal Ices output from the given output line may be a signal obtained by integrating component column signals that are obtained by applying bit weights to column signals of respective individual bit lines. Such a column integrated signal $I_{Cells}$ may be expressed as in Equation 1.

$$I_{Cells}=MI_P+(N-M)I_{AP} \qquad (1)$$

In Equation 1, $I_P$ denotes a current flowing in a resistive memory element in a P state (e.g., the first resistance value) and $I_{AP}$ denotes a current flowing in a resistive memory element in an AP state (e.g., the second resistance value). The column integrated signal $I_{Cells}$ may be a linear combination of $I_P$ and $I_{AP}$ (N and M are discussed below with reference to Equations 3 and 4). A synaptic readout circuit 151 of the output circuit 150 may generate the column integrated signal $I_{Cells}$.

A reference integrated signal Ref of a reference array (e.g., reference array 120) may be obtained in a similar manner, as represented by Equation 2.

$$I_{REF}=XI_P+(N-X)I_{AP} \qquad (2)$$

Equation 2 represents a signal obtained by, for each among resistive memory elements included in the reference memory array 120, applying a bit weight for each bit digit to a current signal flowing in a resistive memory element to which an input signal of "1" (activated) is applied. A reference integrated signal $I_{REF}$ may be a signal that is integrated by applying a bit weight to a reference signal for each bit digit. In this case, X may be determined, based on an application, to be any integer less than or equal to N and greater than or equal to 0. When each reference memory cell 121 is a 1-bit cell, X may have a value of 0 or N.

A reference readout circuit 152 of the output circuit 150 may generate the reference integrated signal $I_{REF}$. In Equations 1 and 2 described above, coefficients N and M of the linear combination may be expressed as in Equations 3 and 4 below, $$N = k \cdot (2^a - 1) \qquad \text{Equation 3}$$

$$M = \sum_{j=0}^{k-1}\sum_{i=0}^{a-1} m_{ij} \cdot 2^i, \qquad \text{Equation 4}$$

where $M \leq N$, $m_{ij} = 0$ or $1$

N denotes a value determined based on the subcells that are connected to whichever k word lines are activated. Variable k denotes the number of word lines (e.g., input lines) that are activated (e.g., "1") out of the K word/input lines, as described above. Variable "a" may be the number of subcells included in each memory cell, i.e., the number of bits of a synaptic weight. For example, N may be a sum of powers of 2 using, as an exponent, a bit digit represented by each subcell included in the synaptic memory cells 111 connected to the activated word line among synaptic memory cells 111 connected to an output line. M, which is an integer less than or equal to N, may be a value determined based on (and reflecting) a number of subcells in the P state (e.g., the first resistance value) among the synaptic memory cells 111 connected to the k activated word lines. For example, mij may be 1 when an ith synaptic memory subcell of an activated jth word line has the first resistance value and may be 0 when the ith synaptic memory subcell of the jth word line has the second resistance value. For example, M may be a sum of powers of 2 using, as an exponent, a bit digit represented by a subcell in the P state in the synaptic memory cells 111 connected to the activated word line among the synaptic memory cells 111 connected to an output line. To summarize, N may be proportional to the number of bits on activated input lines, M may be proportional to the number of bits on activated input lines that are in the P state (e.g., "1").

A net signal $I_{net,column}$, i.e., a net signal of an integrated column signal $I_{Cells}$ and an integrated reference signal $I_{REF}$, may be generated as discussed next with reference to Equation 5.

$$I_{net,column}=I_{Cells}-I_{REF}=(M-X)(I_P-I_{AP}) \qquad (5)$$

Based on Equation 5, the output circuit 150 of the neural network circuit 100 may generate an output signal 159 $I_{net,column}$ corresponding to a difference between ("net" of) the column integrated signal $I_{Cells}$ and the reference integrated signal $I_{REF}$. Note that in some embodiments the signal $I_{net,column}$ may not be what is finally outputted by the output circuit 150, but rather may be processed in a LIF circuit (e.g., LIF circuit 260 in FIG. 3) to control whether a fire-and-reset event occurs.

A difference $I_P-I_{AP}$ between a first current $I_P$ (based on a resistive memory element of the first resistance value) and a second current $I_{AP}$ (based a resistive memory element of the second resistance value) may be referred to as a valid signal or a net signal. Alternatively, because the difference $I_P-I_{AP}$ may be a current (I) signal, the difference may be referred to as a net current. In this case, the output signal 159 $I_{net,column}$ may correspond to M–X times the net signal. M–X may be a positive integer or a negative integer, depending on the value of X, and thus, as discussed below, may be used for IPSP and EPSP.

In the present specification, in some embodiments, the neural network circuit 100 may implement an SNN that simulates the function of a natural neural network by integrating a current based on a synaptic weight, but the examples are not limited thereto. The neural network circuit 100 may also be applied to a system that implements a MAC operation, such as a computation in memory (CIM) circuit and a vector matrix multiplication (VMM) circuit using a memory having a relatively low resistance ratio (and thus lower power consumption). Although a resistance ratio between a low resistance and a high resistance of a resistive memory element may be used in some embodiments of the neural network circuit 100, output values may be distinguished from one another using the above-described net signal, which may be based on a reference signal. In some embodiments of the neural network circuit 100, even when using a resistive memory element of which the resistance ratio of the second resistance value to the first resistance value exceeds 1, output values may be distinguished from one another through the net signal. Accordingly, there may be fewer design restrictions for sensing and summing a current output from a memory array such as a crossbar MRAM.

Accordingly, the neural network circuit 100 may have a memory array with an increased size by offsetting a high resistance state. In addition, the neural network circuit 100 may be applicable to an artificial intelligence processor that processes a large quantity of data.

Furthermore, as described below in detail, in some embodiments the neural network circuit 100 may implement, using the synaptic memory array 110, an excitatory post synaptic potential (EPSP) where potential increases based on an input stimulus, and an inhibitory post synaptic potential (IPSP) where potential decreases based on an input, which are analogous to responses of a natural neural network. More specifically, in some embodiments, the neural network circuit 100 may implement an ESPS that increases a voltage in response to a stimulus when the output signal 159 $I_{net,column}$ is proportional to a positive multiple of the net signal, and may implement an IPSP that decreases a voltage in response to a stimulus when the output signal 159 $I_{net,column}$ is proportional to a negative multiple of the net signal.

For reference, although the present specification describes examples of the output circuit 150 that include an LIF circuit as an activation function circuit, the examples are not limited thereto. For example, instead of an LIF circuit, the neural network circuit 100 may include an analog-to-digital converter to convert the above-described output signal from an analog signal to a digital value (e.g., output data), An electronic device that includes the neural network circuit 100 may also determine a value to be propagated to a next node by applying an activation function to such output data. In other words, the electronic device may also perform an operation corresponding to a digital activation function.

Figure 2:
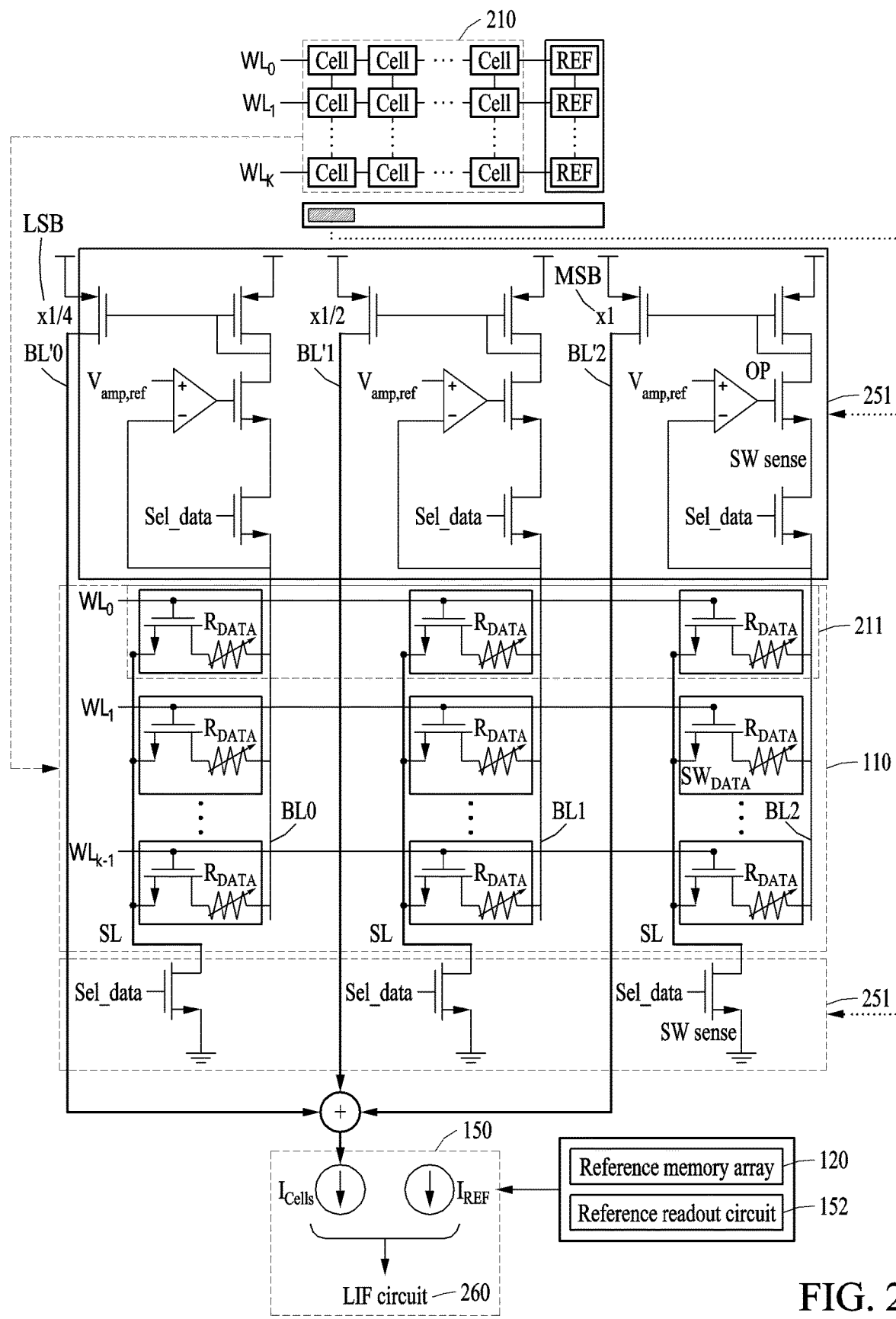
FIG. 2 illustrates an example of a synaptic memory cell and a readout circuit, according to one or more embodiments.

FIG. 2 illustrates an example of a synaptic memory cell and a readout circuit, according to one or more embodiments. An output circuit of a neural network circuit may include an LIF circuit 260 and a synaptic readout circuit 251 connected to a synaptic memory array 210, which may be, for example, the synaptic memory array 110 of FIG. 1. The output circuit may also include a reference readout circuit 152 connected to a reference memory array. Mainly, the synaptic readout circuit 251 is described with reference to FIG. 2, and the reference readout circuit 152 may be configured similar to how the synaptic readout circuit 251 is configured.

As illustrated in FIG. 2, resistive memory elements of synaptic memory cells 211 connected to the same output line may be connected to each other in parallel. The synaptic memory cells 211 may be implemented as the synaptic memory cells 111 of FIG. 1, for example. For example, resistive memory elements connected to the same bit line among the synaptic memory cells 211 connected to the same output line may be connected to each other in parallel. Accordingly, current signals output from the resistive memory elements connected to the same bit line may be integrated along a corresponding output line. In FIG. 2, a resistance of a resistive memory element is denoted by $R_{DATA}$. As described above, each resistive memory element of each cell (elements disposed along bit lines BL0 to BL2) to which an input signal is applied through any of word lines $WL_0$ to $WL_{K-1}$ may output a respective current signal based on a voltage applied to the respective resistive memory element and the resistance value of the respective resistance memory element. When the input signal is applied through word lines $WL_0$ to $WL_{K-1}$, a switch $SW_{data}$ may be turned on.

A switch SWsense (e.g., a transistor) may connect a resistive memory element to a sensing line. In this case, when a signal Sel_data is applied, the switch SWsense (e.g., a transistor) may be turned on. Accordingly, the first, second, and third bit lines BL0 to BL2 and a sensing line SL may respectively be connected to a supply voltage and ground when the input signal is being supplied.

An operation amplifier OP may have a high gain, and regardless of a resistance value between the sensing line SL and the first, second, and third bit lines BL0 to BL2, may fix a voltage of the first, second, and third bit lines BL0 to BL2 to $V_{amp,ref}$. In other words, a constant voltage difference may be maintained between the sensing line SL and the first, second, and third bit lines BL0 to BL2. Resistive memory elements on the fixed voltage $V_{amp,ref}$ (identically applied to ends of each resistive memory element) may each output, on the first, second, and third bit lines BL0 to BL2, a respective current (e.g., a column signal) determined based on the resistance $R_{DATA}$.

The synaptic readout circuit 251 of the output circuit may include a current mirror configured to copy the column signal for each bit of a reference memory cell and each bit of the synaptic memory cell 211 to a current that is of a multiple of the corresponding. For example, the current mirror of the readout circuit 251 may copy a column signal generated in bit lines BL0 to BL2 to respective other bit lines BL'0 to BL'2, and the signals to BL'0 to BL'2 may have varying magnitudes per the current mirror. A magnitude of a copied current may vary depending on a width of a transistor. As described above, the current mirror may copy the column signal at a current copy-ratio corresponding to a bit weight. For example, in FIG. 2, a first bit line BL0, a second bit line BL1, and a third bit line BL3 may have their respective currents copied by respective weights of ×¼, ×½, and ×1.

The readout circuit 251 of the output circuit may generate a column integrated signal $I_{Cells}$ by integrating column signals for each bit of each synaptic memory cell 211 and may generate a reference integrated signal $I_{REF}$ by integrating reference signals for each bit of each reference memory cell. For example, the output circuit may generate the column integrated signal $I_{Cells}$ by summing currents copied from the column signals. The output circuit may generate, for the reference signals, the reference integrated signal $I_{REF}$ through the reference readout circuit 152 having the same or similar structure as the synaptic readout circuit 251 and corresponding operation as described above. For reference, when a resistive memory element is implemented as an MRAM element, read disturbance may not occur when a small current flows through an MTJ. Accordingly, an amplifier capable of processing a relatively low common input may be required. The output circuit may generate an output signal ($I_{net,column}$), based on the column integrated signal $I_{Cells}$ and the reference integrated signal $I_{REF}$, and may further include an LIF circuit 260 configured to process the generated output signal. A structure and an operation of the LIF circuit 260 is described below.

The output circuit, from the synaptic readout circuit 251 described above, by using an output signal $I_{net,column}$ (which is a difference between the column integrated signal $I_{Cells}$ and the reference integrated signal $I_{REF}$) may accurately distinguish between signals when there are one resistive memory element in a P state and a plurality of resistive memory elements in an AP state. Also, because the reference integrated signal $I_{REF}$ is generated by using a reference memory element having a programmable resistance value, an output signal may have a value corresponding to a negative integer multiple of a net signal in addition to a positive integer multiple thereof. Accordingly, the output circuit may express an IPSP in addition to an EPSP.

In other words, because the net signal is a positive number, when the output signal is a positive integer multiple of the net signal, that may be construed as the column integrated signal $I_{Cells}$ being greater than the reference integrated signal $I_{REF}$ (useful for EPSP), and when the output signal is a negative integer multiple of the net signal, that may be construed as that the column integrated signal $I_{Cells}$ being less than the reference integrated signal $I_{REF}$ (useful for IPSP).

As described above with reference to FIG. 2, an output signal may read a resistance value of resistive memory elements included in a synaptic memory array by the readout circuit 251 of the output circuit. As described below with reference to FIG. 3, firing may be performed by using an output signal.

Figure 3:
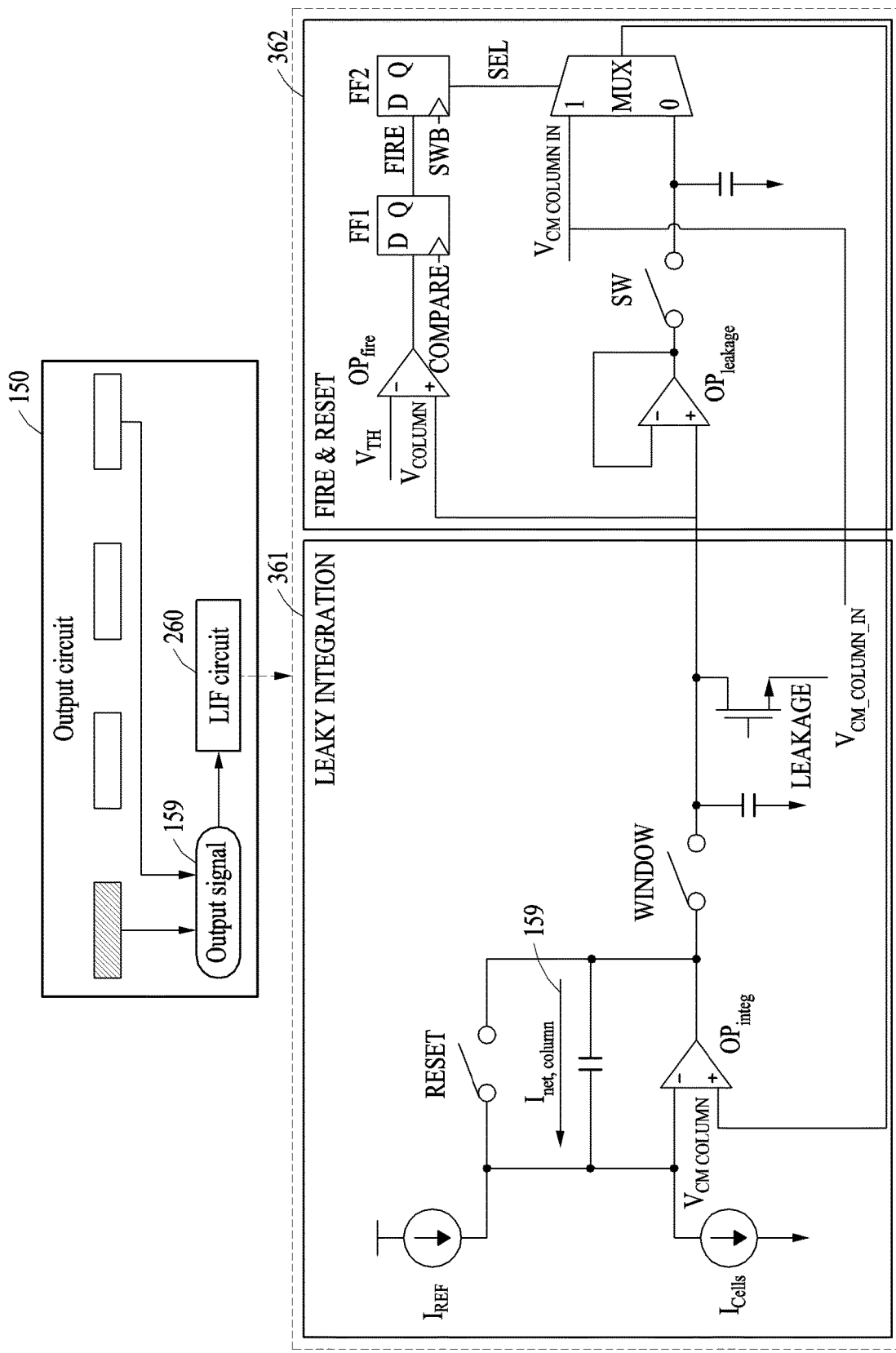
FIG. 3 illustrates an example of a leaky integrate-and-fire (LIF) circuit of an output circuit, according to one or more embodiments.

FIG. 3 illustrates an example of an LIF circuit of an output circuit, according to one or more embodiments.

An output circuit 150 may include an LIF circuit 260. The LIF circuit 260 may be a circuit for simulating a neuron spiking operation, and, based on a result of comparing an output signal 159 with a threshold, may perform a firing output that is provided as an input to another neuron circuit (e.g., as an input to a word of the other neuron circuit). The output signal 159 is $I_{net,column}$ described above in Equation 5. The LIF circuit 260 may include a leakage sub-circuit 361 and a firing sub-circuit 362.

A post-synaptic potential may include an EPSP, where voltage increases in response to a stimulus, and an IPSP, where voltage decreases in response to a stimulus. An action potential may occur in a neuron when a stimulus exceeding a threshold is transmitted from a pre-neuron to a post-neuron, or when a plurality of stimuli less than or equal to the threshold are transmitted multiple times within a short time and the corresponding accumulated stimulus exceeds the threshold. Subsequently to a neuron exceeding the threshold (and firing), a membrane potential of the neuron may be reset to a base voltage. However, when a stimulus less than or equal to the threshold is transmitted from the pre-neuron to the post-neuron, instead of the action potential, a post-synaptic potential (PSP) may occur, and in the PSP, gradual leaking may occur until a next stimulus is applied. The LIF circuit 260 may be a circuit that implements the above-described firing or leakage of artificial neurons.

The leakage sub-circuit 361 may receive a column integrated signal and a reference integrated signal described above with reference to FIG. 2. In FIG. 3, for ease of description, the column integrated signal and the reference integrated signal are modeled and illustrated as current sources $I_{Cells}$ and $I_{REF}$, respectively. The column integrated signal and the reference integrated signal may actually be currents supplied, respectively, by the synaptic readout circuit 251 and the similarly configured reference readout circuit 152 illustrated in FIG. 2. The leakage sub-circuit 361 may include a capacitor that provides leakage. For example, the output signal 159 may allow a current corresponding to the reference integrated signal to flow in a node of the capacitor and may allow a current corresponding to the column integrated signal to flow out from the same node of the capacitor. The flow-in of the reference integrated signal and the flow-out of the column integrated signal may allow a current corresponding to a difference between the column integrated signal and the reference integrated signal to flow in the capacitor.

The output circuit 150 may generate, as the output signal 159, a current corresponding to an integer multiple of a net current, which is a difference between a first current IF (based on a resistive memory element having a first resistance value) and a second current IAP (based on a resistive memory element having a second resistance value). The leakage sub-circuit 361 may be deactivated while a reset signal RESET is applied and may be activated while a reset signal RESET is disapplied. In other words, the leakage sub-circuit 361 may leak an output current based on the output signal 159 for a threshold time after the reset signal RESET is disapplied.

The output current of the output signal 159 may be converted to an output voltage by flowing in the capacitor. A leakage operational amplifier $OP_{integ}$ of the leakage sub-circuit 361 may be connected to a window switch at an output terminal, and the window switch may be connected to a capacitor connected to ground. While a window signal WINDOW is applied to the window switch, the leakage operational amplifier $OP_{integ}$ may be connected to the capacitor, which is connected to ground. Accordingly, the output current of the output signal 159 may flow in the capacitor connected to ground and at the output terminal of the leakage operational amplifier $OP_{integ}$. The capacitor connected to ground may convert the output current to an output voltage by leaking a charge based on the output current. In this case, a voltage charged in the capacitor connected to ground may be leaked by a leakage transistor LEAKAGE.

A bias voltage based on $V_{CM\_COLOUMN\_IN}$ may be applied to the leakage transistor LEAKAGE. The window switch may be turned on for a predetermined threshold time (e.g., a leakage time) by the window signal WINDOW. In other words, the capacitor connected to ground may leak the output current after reset until the threshold time elapses.

The leakage sub-circuit 361 may transmit, to the firing sub-circuit 362, the output voltage leaked for the above-described threshold time. A comparator $OP_{fire}$ of the firing sub-circuit 362 may compare a predetermined threshold voltage $V_{TH}$ to an output voltage $V_{COLUMN}$. For example, the comparator $OP_{fire}$ may output a firing signal (e.g., 1) when the output voltage $V_{COLUMN}$ integrated for the threshold time exceeds the threshold voltage $V_{TH}$ and may output a leakage signal (e.g., 0) when the output voltage $V_{COLUMN}$ is less than or equal to the threshold voltage $V_{TH}$.

For reference, as described below, the threshold time may be set, by a separate circuit (e.g., a threshold time generation circuit), to a time suitable to achieve the threshold voltage $V_{TH}$ by leaking a threshold current corresponding to a threshold. The output current and the threshold current both are currents and comparing one current to another current may present challenges. Accordingly, the comparator $OP_{fire}$ of the firing sub-circuit 362 may compare, with the threshold voltage, a voltage converted from a current leaked for the threshold time, which is from when (i) a signal RESET based on a signal WINDOW (described below with reference to FIG. 7) turns to 0 to (ii) when the signal WINDOW turns to 0. When an amount of current is small, an amount of current converted to a voltage may also be small, and the voltage may thus be less than the threshold voltage. Conversely, when an amount of current is large, an amount of current converted to a voltage may also be large, and the voltage may thus be greater than or equal to the threshold voltage. Accordingly, the comparator $OP_{fire}$ may output a firing pulse.

The LIF circuit 260, in response to a voltage integrated ($V_{COLUMN}$) based on the output signal 159 not reaching the threshold voltage within the threshold time, may leak the output signal 159. For example, the firing sub-circuit 362 of the LIF circuit 260, when a leaked output voltage is less than the threshold voltage, may transmit the output voltage to the leakage operational amplifier $OP_{integ}$. An analog multiplexer (MUX) may provide the output voltage as a new common mode input $V_{CM\_COLUMN}$ of the leakage operational amplifier $OP_{integ}$. The leakage sub-circuit 361, when the output signal 159 is generated based on a next neuron input, may obtain a leaked output voltage by continuing the leakage by using an output current based on the above-described common mode input $V_{CM\_COLUMN}$.

The LIF circuit 260, in response to the voltage integrated based on the output signal 159 reaching the threshold voltage within the threshold time corresponding to a threshold, may perform firing that is outputted to another neuron circuit. For example, when the leaked output voltage exceeds the threshold voltage, or when a leaked voltage of a plurality of small output signals (e.g., the output signal 159) exceeds the threshold voltage, the comparator $OP_{fire}$ of the firing sub-circuit 362 may generate a firing signal. The firing signal may be a pulse output indicating firing. The firing signal may be generated as a signal synchronized with a clock signal through a flip-flop circuit and the comparator $OP_{fire}$, based on an analog amplifier synchronized with the clock signal.

The firing sub-circuit 362 may initialize a common mode voltage by controlling a selection signal SEL of an analog MUX circuit and transferring $V_{CM\_COLUMN\_IN}$ input from the outside to the leaky operational amplifier $OP_{integ}$.

The output circuit 150 may classify operations into integration, comparison, and leakage for each circuit and perform the corresponding operations. Accordingly, an error caused by limitations of a leakage current or the size of the capacitor may be reduced in the output circuit 150. Furthermore, the output circuit 150 may stimulate firing in units of milliseconds (ms), which is a time interval of stimulation of a living organism.

In FIG. 3, the signals RESET and SW may be generated by a timing generator that receives an external clock signal Clk as control signals. The threshold time generation circuit (described below) may generate a window signal WINDOW indicating a threshold time that may determine whether firing is performed. The window signal WINDOW may provide a threshold time (e.g., an integration time) that is robust against a set threshold voltage, a resistive memory element, and a variation of the capacitor.

Figure 4:
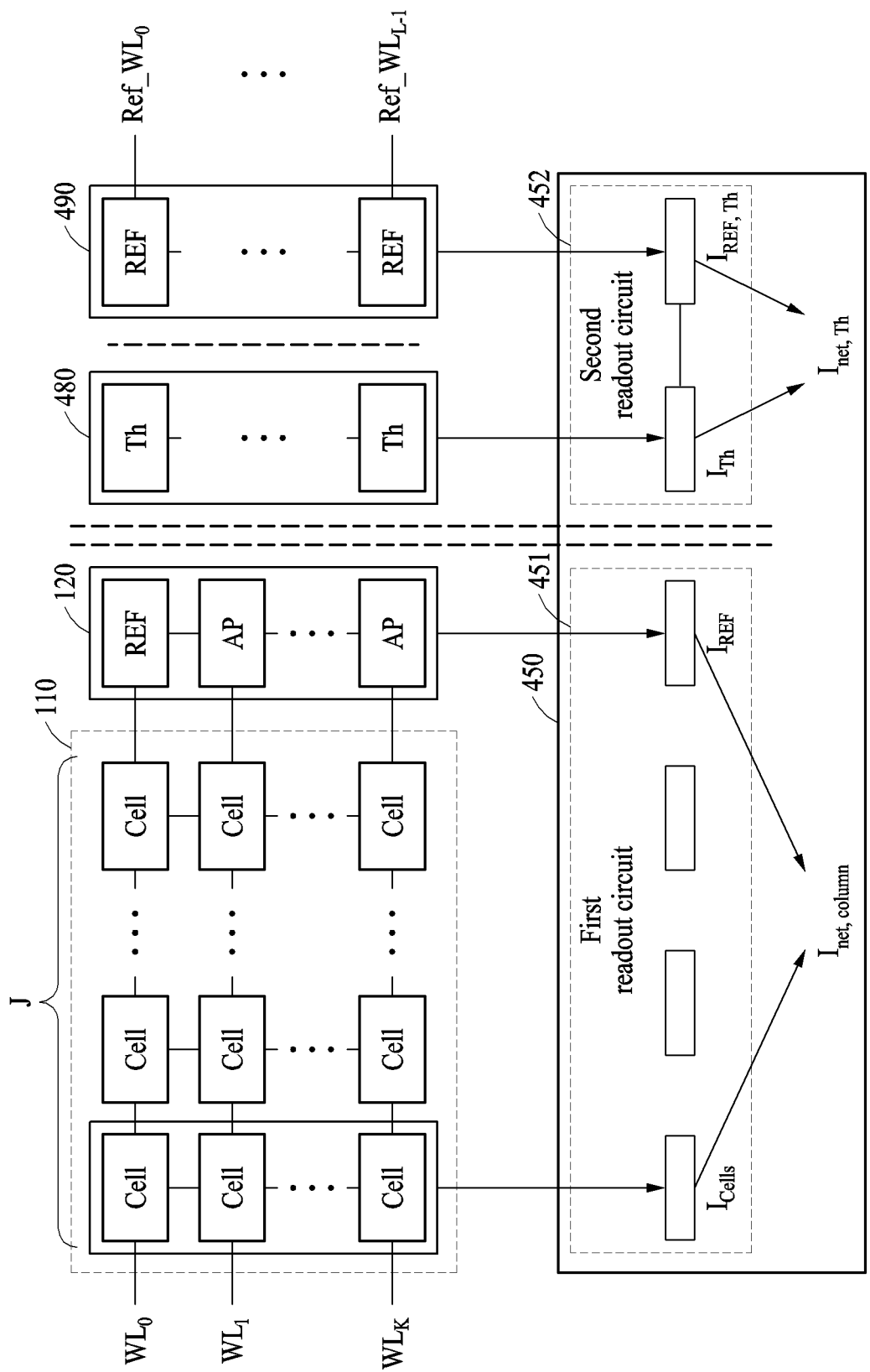
FIG. 4 illustrates an example of a threshold generation circuit and an additional reference circuit included in a neural network circuit, according to one or more embodiments.

FIG. 4 illustrates an example of a threshold generation circuit and an additional reference circuit included in a neural network circuit, according to one or more embodiments.

The neural network circuit may further include a circuit to set a threshold. For example, the neural network circuit may further include a threshold memory array 480 and an additional reference memory array 490. A synaptic memory array 110 and a reference memory array 120 have been described above with reference to FIG. 1.

The threshold memory array 480 may include a plurality of memory elements. At least one memory element (designated based on a set threshold among the plurality of memory elements in the threshold memory array 480) may have a first resistance value (e.g., a P state). In FIG. 4, a memory cell included in the threshold memory array 480 may be a threshold memory cell and may be denoted by Th. For example, a memory element for expressing a threshold may be selected based on a bit digit. In other words, the threshold may be expressed based on the number of memory elements having the first resistance value and a bit digit represented by a memory element.

The threshold memory array 480 may include threshold memory cells disposed along a column line. The column line may include a plurality of bit lines representing multiple bits. Each of the threshold memory cells may include subcells for each bit line, respectively. For example, when the threshold is set as a threshold current of 6IP, a memory element corresponding to a first bit digit (e.g., $2^1=2$) from the LSB in the threshold memory array 480 and a memory element corresponding to a second bit digit (e.g., $2^2=4$) from the LSB may have the first resistance value, to thereby express (2+4)*IP.

An additional reference memory cell may share reference word lines Ref WL 0 to Ref WN L−1 with the threshold generation circuit. The additional reference memory cell may have an additional reference memory element that is disposed along a reference word line and that has a second resistance value. The additional reference memory element of an additional reference memory cell of the additional reference memory array 490 may have a programmable resistance value, which may be programmed based on an application. The additional reference memory cell, described below, may be used to express, as a net signal, the designated threshold in the threshold memory array 480 described above.

For example, a signal (hereinafter, referred to as a "threshold integrated signal") integrated along a column of the threshold memory array 480 described above may be expressed as in Equation 6 below.

$$I_{Th}=TI_P+(R-T)I_{AP} \qquad (6)$$

In Equation 6 above, $I_P$ denotes a current flowing in a resistive memory element in a P state (e.g., a first resistance value) and $I_{AP}$ denotes a current flowing in a resistive memory element in an AP state (e.g., a second resistance value). The threshold integrated signal $I_{Th}$ may be a linear combination of $I_P$ and $I_{AP}$. A second readout circuit 452 of the output circuit 450 may generate the threshold integrated signal $I_{Th}$.

$$I_{REF,Th}=YI_P+(R-Y)I_{AP} \qquad (7)$$

Equation 7 represents a signal obtained by applying a bit weight for each bit digit to a current signal flowing in a resistive memory element to which a reference word signal is applied among resistive memory elements included in the additional reference memory array 490. An additional reference integrated signal $I_{REF,Th}$ may be a signal integrated by applying a bit weight to a reference signal for each bit digit. In this case, Y may be determined to be either an integer less than or equal to R and greater than or equal to 0, based on an application. When the additional reference memory array 490 is configured with a 1-bit cell, Y may have a value of 0 or R.

The second readout circuit 452 of the output circuit 450 may generate the additional reference integrated signal $I_{REF,Th}$. In Equations 6 and 7, coefficients T and R of the linear combination may be expressed as in Equations 8 and 9 below.

$$R = L \cdot (2^a - 1) \qquad \text{Equation 8}$$

$$T = \sum_{j=0}^{k-1} \sum_{i=0}^{a-1} t_{ij} \cdot 2^i, \qquad \text{Equation 9}$$

where $T \leq R$, $t_{ij} = 0$ or $1$

R denotes a value determined based on subcells connected to an activated reference word line. L denotes the number of activated reference word lines. FIG. 4 illustrates an example in which all reference word lines are activated. The variable "a" may be the number of subcells included in each memory cell or the number of bits of a synaptic weight. For example, R may be a sum of values of powers of 2 using, as an exponent, a bit digit represented by each subcell included in a reference memory cell connected to the activated reference word line among threshold memory cells connected along a column. T may be an integer less than or equal to R and may be a value determined based on subcells in a P state (e.g., the first resistance value) among threshold memory cells connected to the activated reference word line. T may correspond to a preset threshold. The variable $t_{ij}$ may be 1 when an ith threshold memory subcell of an activated jth word line has the first resistance value and may be 0 when the ith threshold memory subcell thereof has the second resistance value. For example, T may be a sum of "k" values of power of 2 using, as an exponent, a bit digit represented by a subcell in a P state in threshold memory cells connected to the same column.

$$I_{net,Th} = I_{Th} - I_{REF,Th} = (T-Y)(I_P - I_{AP}) \qquad (10)$$

The output circuit 450 of the neural network circuit may generate a threshold net signal $I_{net,Th}$ corresponding to a difference between the threshold integrated signal $I_{Th}$ and the additional reference integrated signal $I_{REF,Th}$ according to Equation 10 described above. The output circuit 450 may compare the threshold net signal $I_{net,Th}$ obtained based on Equation 10 with an output signal $I_{net,column}$ obtained from a first readout circuit 451 (e.g., a circuit including the synaptic readout circuit 151 and the reference readout circuit 152 of FIG. 1), based on Equation 5. However, current-to-current comparison is not readily implemented in a circuit as described above, and the output circuit 450 may further include a threshold time generation circuit configured to indirectly compare the output signal $I_{net,column}$ with the threshold net signal $I_{net,Th}$. The threshold time generation circuit is described below with reference to FIG. 7.

The output circuit 450 may apply a threshold time corresponding to a threshold determined based on a threshold memory cell and an additional reference memory cell to an output signal for an output line and another output signal for another output line. In other words, the output circuit 450 may apply a threshold time corresponding to a common threshold to output signals obtained from output lines of a synaptic memory array.

Figure 5A:
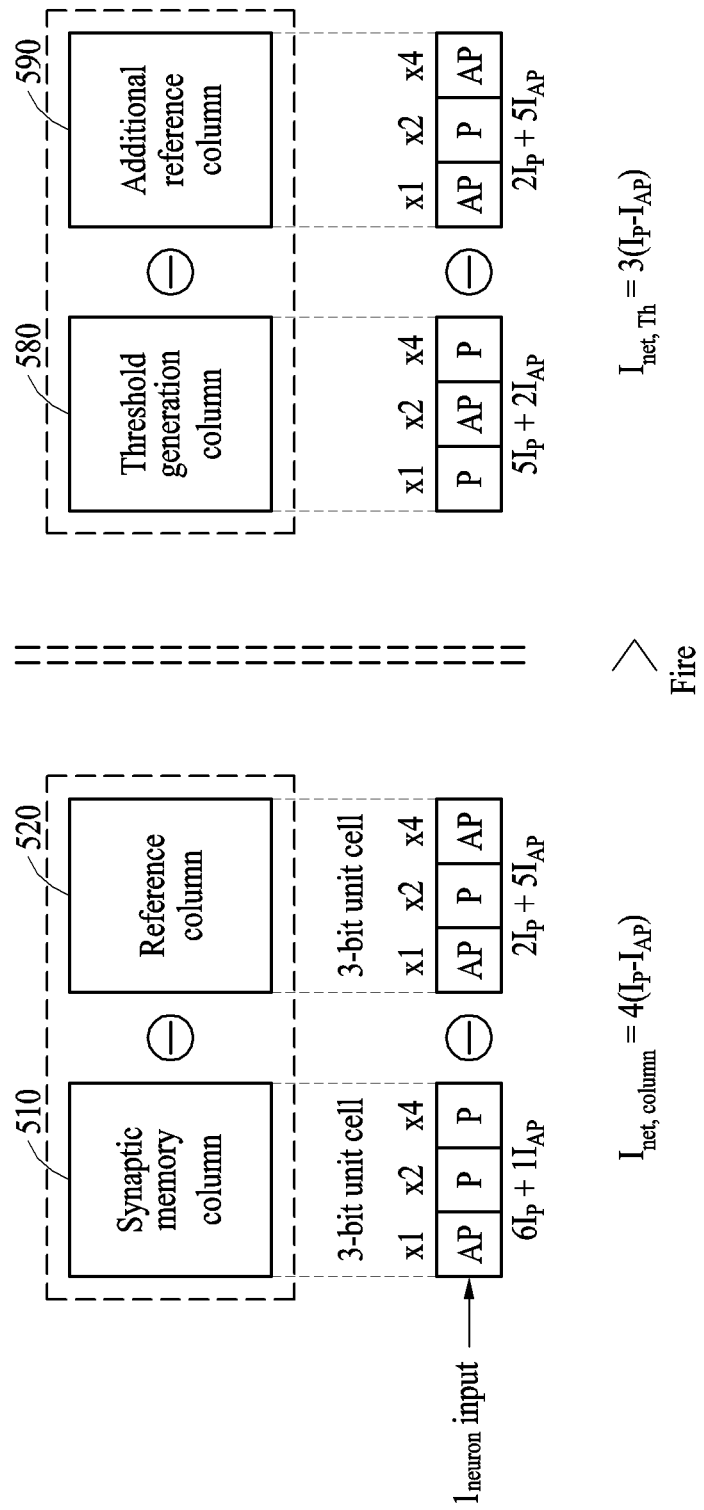
FIG. 5A illustrates an example of a net signal generated from a synaptic memory column and a reference column, a threshold generation column, and an additional reference column, according to one or more embodiments.
Figure 5B:
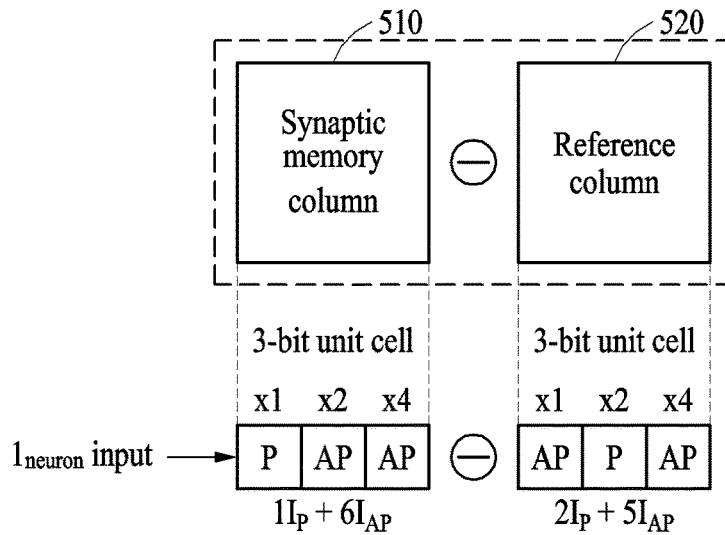
FIG. 5B illustrates an example of a net signal generated from a synaptic memory column and a reference column, according to one or more embodiments.
Figure 5C:
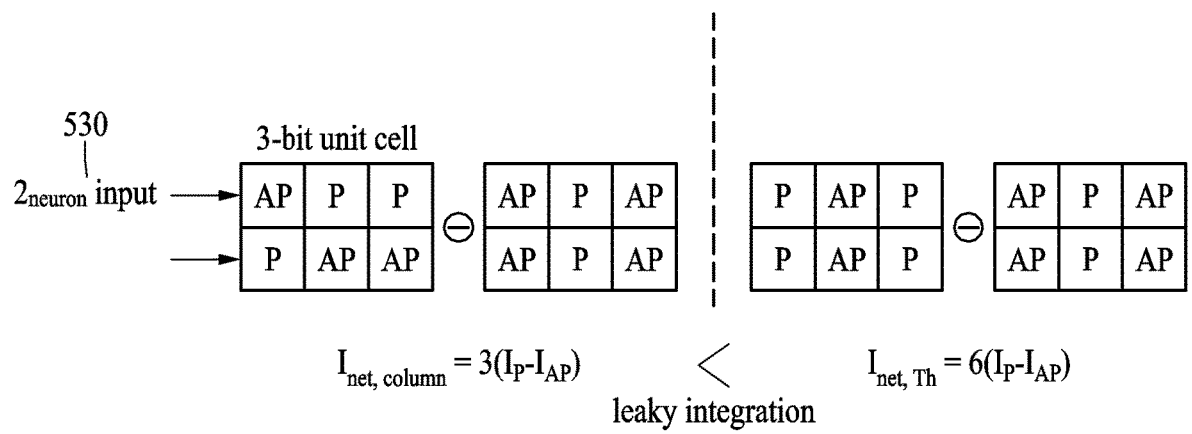
FIG. 5C illustrates an example of a firing comparison using net signals generated from a synaptic memory column, a reference column, a threshold generation column, and an additional reference column, according to one or more embodiments.

FIGS. 5A through 5C illustrate examples of a firing comparison using net signals generated from a synaptic memory column, a reference column, a threshold generation column, and an additional reference column.

In FIG. 5A, one column of a synaptic memory array is illustrated as a synaptic memory column 510. In addition, one column of a reference memory array is illustrated as a reference column 520. One column of a threshold memory array is illustrated as a threshold generation column 580. One column of an additional reference memory array is illustrated as an additional reference column 590. For ease of description, each column may include 3-bit bit lines, for example, and an input signal may be applied to one input line.

For example, a third subcell of the synaptic memory column 510 may have a resistive memory element set to a second resistance value (e.g., AP), and first and second subcells thereof may respectively have resistive memory elements set to a first resistance value (e.g., P). First and third subcells of the reference column 520 may have a memory element set to the second resistance value (e.g., AP), and a second subcell thereof may have a memory element set to a first resistance value (e.g., P). However, a resistance value of each of the first, second, and third subcells of the reference column 520 is not limited to the foregoing example and may be variously changed, based on an application.

The first, second, and third subcells may generate current signals to which a bit weight (e.g., times 1) corresponding to the LSB, a bit weight (e.g., times 2) corresponding to a first bit digit from the LSB, and a bit weight (e.g., times 4) corresponding to a second bit digit from the LSB are applied, respectively. A column integrated signal Ices of the synaptic memory column 510 may be $(2+4)*I_P+1*I_{AP}$. A reference integrated signal $I_{REF}$ of the reference column 520 may be $2*I_P+(1+4)*I_{AP}$. The output signal $I_{net,column}$ may be $4(I_P-I_{AP})$. As the output signal $I_{net,column}$ is a positive number, the output signal $I_{net,column}$ may be construed as an output signal for performing an EPSP operation.

Similarly, a threshold integrated signal $I_{Th}$ in the threshold generation column 580 may be $2*I_{AP}+(1+4)*I_{AP}$. The additional reference integrated signal $I_{REF,Th}$ generated in the additional reference column 590 may be $2*I_P(1+4)I_{AP}=2I_P+5I_{AP}$. In FIG. 5A, a threshold net signal $I_{net,Th}$ may be determined to be $3(I_P-I_{AP})$. An output circuit may generate a firing signal because the output signal $I_{net,column}$ is greater than the threshold net signal $I_{net,Th}$.

Referring to FIG. 5B, a third subcell of a synaptic memory column 510 may have a resistive memory element set to a first resistance value, and first and second subcells thereof may respectively have resistive memory elements set to a second resistance value. A cell of a reference column 520 may be, similar to that of FIG. 5A; first and third subcells thereof may respectively have resistive memory elements set to the second resistance value, and a second subcell thereof may have a resistive memory element set to the first resistance value. However, a resistance value of each of the first, second, and third subcells of the reference column 520 is not limited to the foregoing example and may be variously changed, based on an application.

The first, second, and third subcells may generate current signals to which a bit weight (e.g., times 1) corresponding to the LSB, a bit weight (e.g., times 2) corresponding to a first bit digit from the LSB, and a bit weight (e.g., times 4) corresponding to a second bit digit from the LSB are applied, respectively. A column integrated signal $I_{Cells}$ of the synaptic memory column 510 may be $1*I_P+(2+4)I_{AP}$. A reference integrated signal $I_{REF}$ of the reference column 520 may be $2*I_P+(1+4)I_{AP}$. An output signal $I_{net,column}$ may be $-1(I_P-I_{AP})$. As the output signal $I_{net,column}$ is a negative number, the output signal $I_{net,column}$ may be construed as an output signal for performing an IPSP operation.

FIG. 5C illustrates an example of an input signal 530 applied through two input lines.

An output signal $I_{net,column}$ in FIG. 5C may be $4(I_P-I_{AP})-(1P-I_{AP})=3(I_P-I_{AP})$, which is obtained by combining the output signals of FIGS. 5A and 5B. Similarly, a threshold net signal $I_{net,Th}$ may be determined to be $6(I_P-I_{AP})$. An output circuit may perform a leakage operation because the output signal $I_{net,column}$ is less than the threshold net signal $I_{net,Th}$.

Figure 6A:
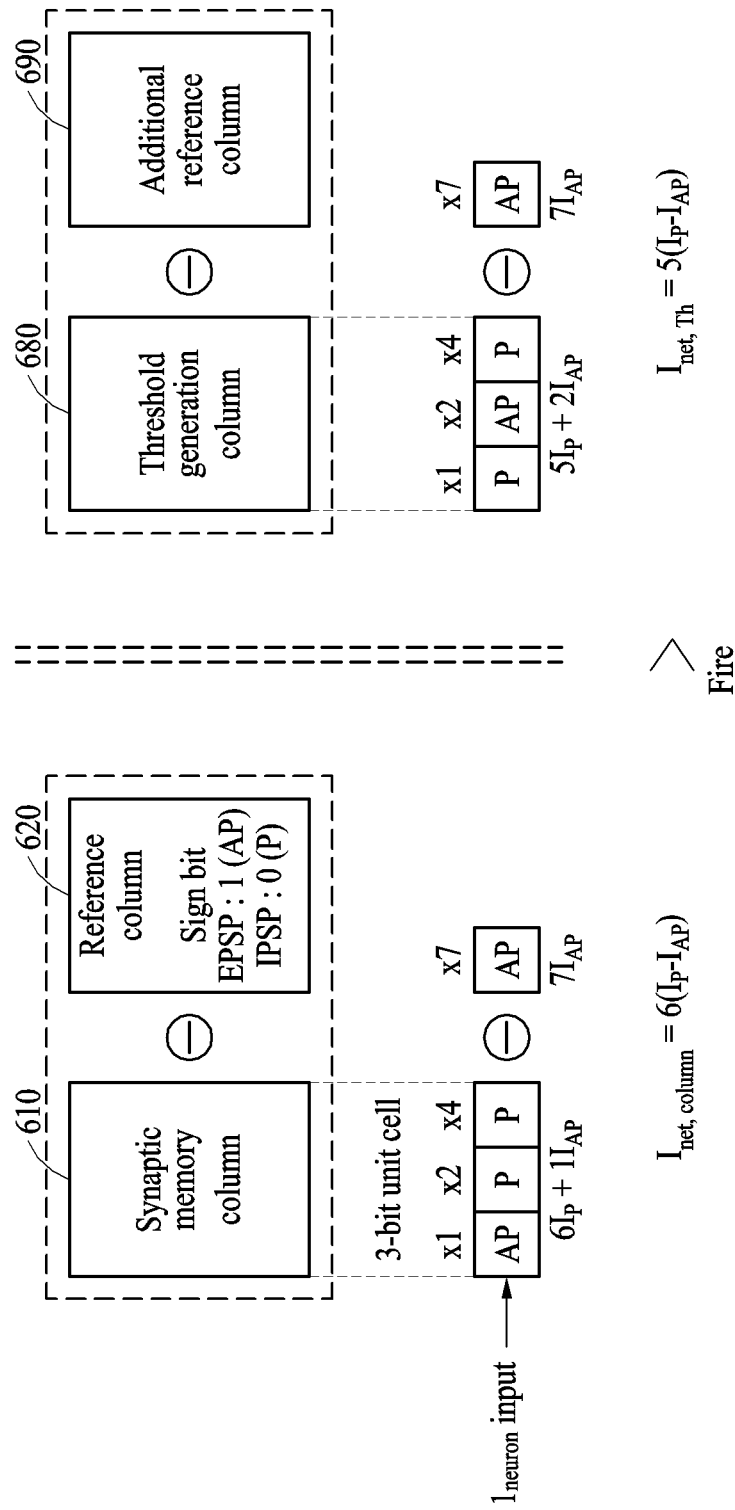
FIG. 6A illustrates an example of a firing comparison using net signals generated from a synaptic memory column, a reference column, a threshold generation column, and an additional reference column, according to one or more embodiments.
Figure 6B:
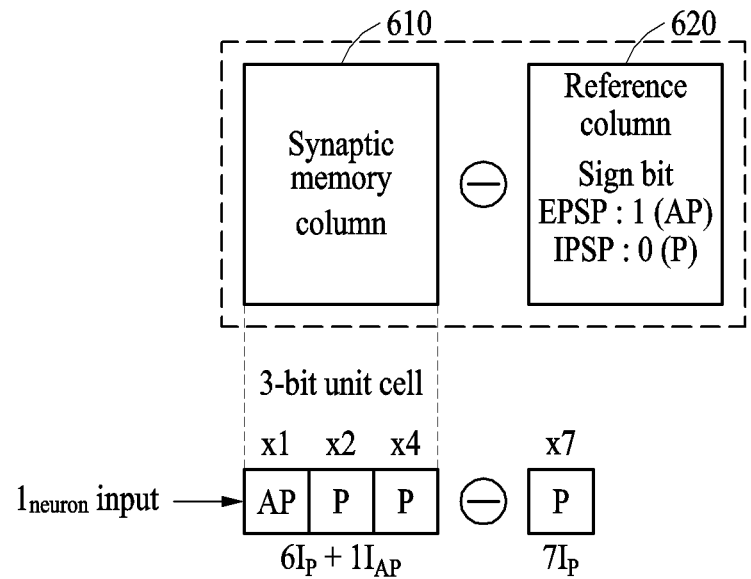
FIG. 6B illustrates an example of a net signal generated from a synaptic memory column and a reference column, according to one or more embodiments.
Figure 6C:
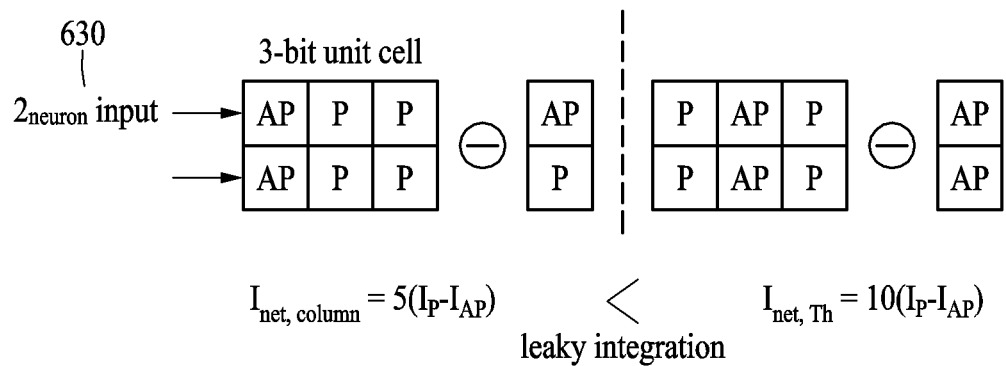
FIG. 6C illustrates an example of a leaky integration comparison using net signals generated from a synaptic memory column, a reference column, a threshold generation column, and an additional reference column, according to one or more embodiments.

FIGS. 6A through 6C illustrate other examples of a firing comparison using net signals generated from a synaptic memory column, a reference column, a threshold generation column, and an additional reference column.

In FIG. 6A, one column of a synaptic memory array is illustrated as a synaptic memory column 610. In addition, one column of a reference memory array may be illustrated as a reference column 620. One column of a threshold memory array may be illustrated as a threshold generation column 680. One column of an additional reference memory array may be illustrated as an additional reference column 690. For ease of description, each column may include 3-bit bit lines and an input signal may be applied to one input line.

For example, a third subcell of the synaptic memory column 610 may have a resistive memory element set to a first resistance value, and first and second subcells thereof may respectively have resistive memory elements set to a second resistance value. The reference column 620 may be a 1-bit cell for storing single-bit information (e.g., a sign bit), regardless of the number of bits of the synaptic memory column 610. Specifically, the reference column 620 may have, in the 1-bit cell, a resistive memory element set to the second resistance value or the first resistance value, based on whether an operation to be simulated is an EPSP or an IPSP. In FIG. 6A, the operation to be simulated is an EPSP and the 1-bit cell of the reference column 620 may have a resistive memory element set to the second resistance value.

The first, second, and third subcells of the synaptic memory column 610 may generate current signals to which a bit weight (e.g., times 1) corresponding to the LSB, a bit weight (e.g., times 2) of a first bit digit from the LSB, and a bit weight (e.g., times 4) of a second bit digit from the LSB are applied, respectively. A column integrated signal $I_{Cells}$ of the synaptic memory column 610 may be $(4+2)*I_P+1*I_{AP}$.

The 1-bit cell of the reference column 620 may generate a current signal to which a predetermined bit weight (e.g., times 7) is applied. A reference integrated signal $I_{REF}$ of the reference column 620 may be $7*I_{AP}$. The output signal $I_{net,coulumn}$ may be $6(I_P-I_{AP})$. As the output signal $I_{net,column}$ is a positive number, the output signal $I_{net,column}$ may be construed as an EPSP.

Similarly, a threshold integrated signal $I_{Th}$ in the threshold generation column 680 may be $2*I_{AP}+(1+4)*I_P=5_{IP}+2I_{AP}$. An additional reference integrated signal $I_{REF,Th}$ generated in the additional reference column 690 may be $7*I_{AP}$. In FIG. 6A, a threshold net signal $I_{net,Th}$ may be determined to be $5(I_P-I_{AP})$. An output circuit may generate a firing signal because the output signal $I_{net,column}$ is greater than the threshold net signal $I_{net,Th}$.

Referring to FIG. 6B, a third subcell of a synaptic memory column 610 may have a resistive memory element set to a second resistance value, and first and second subcells may have resistive memory elements set to a first resistance value. In FIG. 6B, an operation to be simulated is an IPSP, and a 1-bit cell of a reference column 620 may have a resistive memory element set to the first resistance value.

The first, second, and third subcells of the synaptic memory column 610 may generate current signals to which a bit weight (e.g., times 1) corresponding to the LSB, a bit weight (e.g., times 2) of a first bit digit from the LSB, and a bit weight (e.g., times 4) of a second bit digit from the LSB are applied, respectively. A column integrated signal $I_{Cells}$ of the synaptic memory column 610 may be $(2+4)*I_P+1*I_{AP}$.

The 1-bit cell of the reference column 620 may generate a current signal to which a predetermined bit weight (e.g., times 7) is applied. A reference integrated signal $I_{REF}$ of the reference column 620 may be $7*IP$. An output signal $I_{net,column}$ may be $-1(I_P-I_{AP})$.

FIG. 6C illustrates an example of an input signal 630 applied to two input lines.

An output signal $I_{net,column}$ in FIG. 6C may be $6(I_P-I_{AP})-(I_P-I_{AP})=5(I_P-I_{AP})$ obtained by combining the output signals of FIGS. 6A and 6B. Similarly, a threshold net signal $I_{net,Th}$ may be determined to be $10(I_P-I_{AP})$. An output circuit may perform a leakage operation because the output signal $I_{net,column}$ is less than the threshold net signal $I_{net,Th}$.

Figure 7:
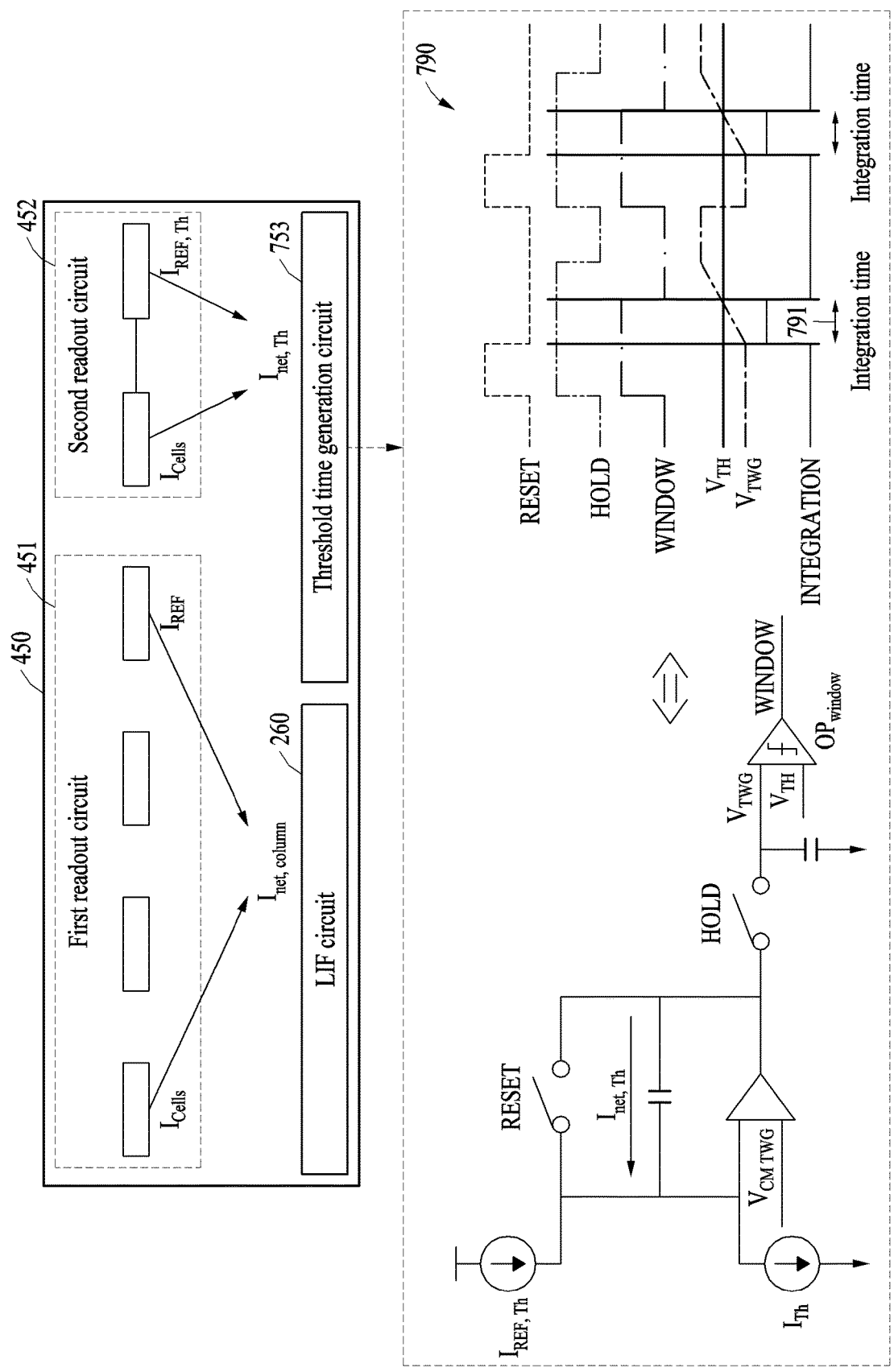
FIG. 7 illustrates an example of a threshold time generation circuit of an output circuit, according to one or more embodiments.

FIG. 7 illustrates an example of a threshold time generation circuit of an output circuit.

The output circuit may set a threshold time 791 corresponding to a threshold, based on a signal generated based on a threshold memory cell and a signal generated based an additional reference memory cell. In FIG. 7, a threshold time generation circuit 753 for setting the threshold time 791 in the output circuit is described. The first readout circuit 451, the second readout circuit 452, and the LIF circuit 260 are described above.

Since it may be difficult to directly compare an output current to a current set to a threshold, as described above, the threshold time generation circuit 753 may set the threshold time 791 for current comparison. The threshold time generation circuit 753 may set, as the threshold time 791, a time used to reach a threshold voltage through a leakage of a current corresponding to the threshold. As described above, the output circuit may determine whether a time used to reach the same threshold voltage through a leakage of an output current is less than the threshold time 791. For example, the output circuit may indirectly compare a threshold current to an output current by determining whether an output voltage converted from a leakage of the output current exceeds a threshold voltage within the set threshold time 791.

The output circuit may initiate an integration of a current corresponding to a difference between a signal generated based on a threshold memory cell and a signal generated based on an additional reference memory cell. When a voltage corresponding to the integrated current exceeds the threshold voltage, the output circuit may output a signal indicating the threshold time 791 corresponding to the threshold.

The threshold time generation circuit 753 may have a configuration similar to the leakage sub-circuit 361 described above with reference to FIG. 3. For example, the threshold time generation circuit 753 may allow a threshold integrated signal $I_{Th}$ to flow in a node of a capacitor and allow an additional reference integrated signal $I_{REF,Th}$ to flow out from the node of the capacitor. Accordingly, a threshold net signal $I_{net,Th}$ may flow in the capacitor. The types and sizes of the capacitor and an operational amplifier may be designed to be the same.

A reset signal RESET and a hold signal HOLD shown in a timing diagram 790 may be generated by a timing generator. When the reset signal is RESET=1, voltages at both ends of the capacitor in which the threshold net signal $I_{net,Th}$ flows are $V_{CM}$ and $V_{TWG}$ and thus are initialized. When the reset signal is RESET=0 and the hold signal is HOLD=1, a voltage $V_{TWG}$ converted from integration based on the threshold net signal $I_{net,Th}$ may be stored in the capacitor. The voltage $V_{TWG}$ may gradually increase based on the integration of the threshold net signal $I_{net,Th}$. A window comparator $OP_{window}$ may output 0 when the voltage $V_{TWG}$ exceeds a threshold voltage $V_{TH}$. Accordingly, the threshold time 791 may be defined to be the time from when the reset signal is RESET=0 to when the window signal is WINDOW=0. $V_{CM,TWG}$ may be set to be less than $V_{CM\_COLUMN\_IN}$. For example, when the output signal $I_{net,column}$ and the threshold net signal $I_{net,Th}$ are the same, for example, $I_{net,column}=7I_P-7I_{AP}$, $I_{net,Th}=7I_P-7I_{AP}$, an example of $7I_P-7I_{AP}$ may be confirmed as firing only when the voltage $V_{TWG}$ (based on $V_{CM\_COLUMN\_IN}$) is greater than the threshold voltage $V_{TH}$ (based on $V_{CM,TWG}$).

Figure 8:
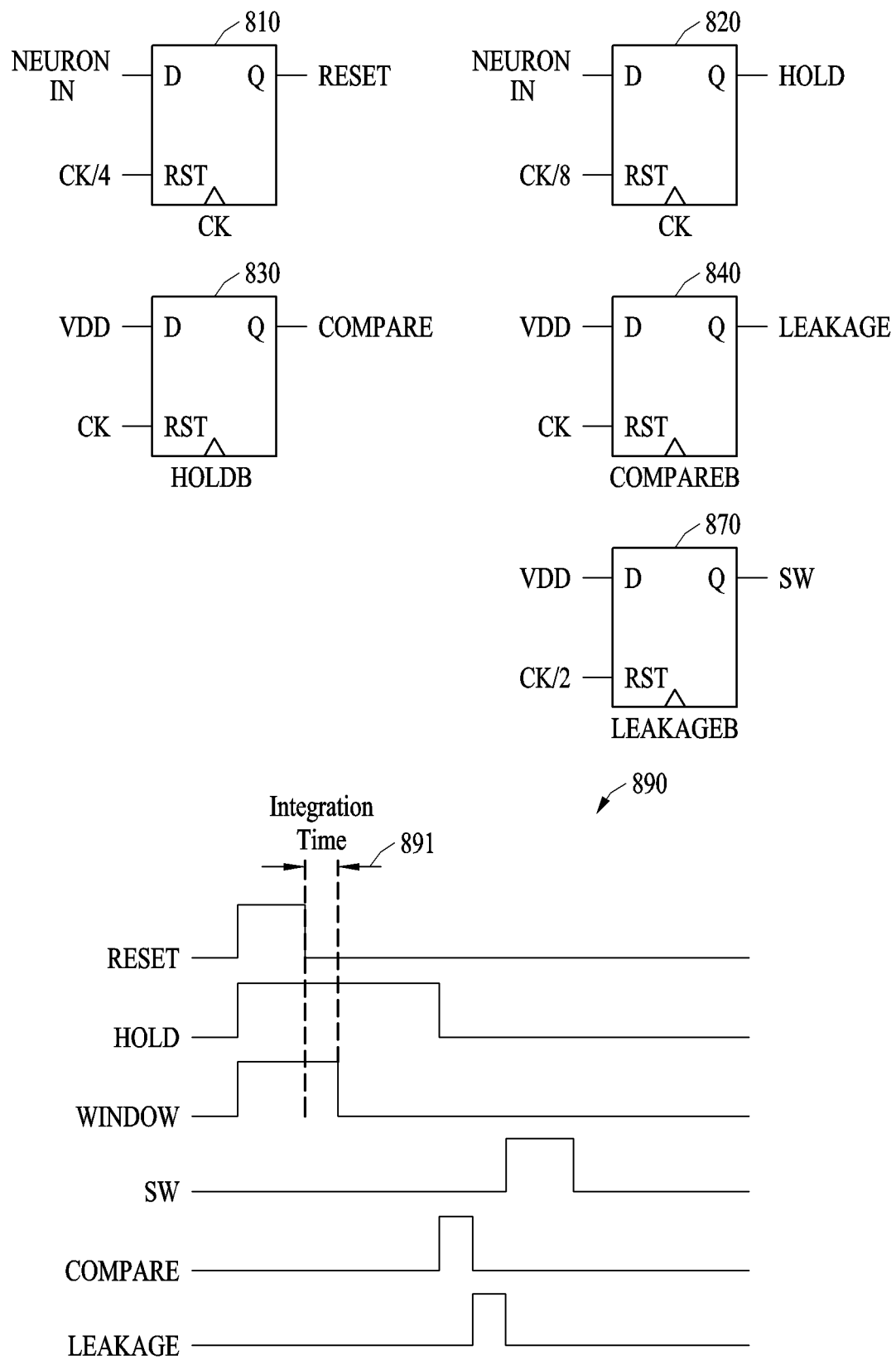
FIG. 8 illustrates an example of elements included in an LIF circuit in an output circuit and a timing diagram for each of the elements, according to one or more embodiments.

FIG. 8 illustrates an example of elements included in an LIF circuit in an output circuit and a timing diagram for each of the elements.

A reset flip-flop 810 may generate a reset signal RESET in response to a clock signal divided by 4 and a neuron input (an input signal). A hold flip-flop 820 may generate a hold signal HOLD in response to a clock signal divided by 8 and a neuron input (an input signal). A comparison flip-flop 830 may generate a comparison signal COMPARE in response to a clock signal, a supply voltage VDD, and an inverted hold signal HOLDS. The comparison signal COMPARE may be a signal to initiate a comparison operation of a comparator when an integrated output signal has been transmitted to an input of the comparator. A leakage flip-flop 840 may generate a leakage signal LEAKAGE in response to a clock signal, a supply voltage VDD, and an inverted comparison signal COMPARES. The leakage signal LEAKAGE may be a signal to perform a leakage operation of an output voltage after the above-described comparison operation. An SW flip-flop 870, when there is a leaked voltage, may generate an SW signal to transmit the leaked voltage to a leakage sub-circuit such that the leaked voltage is combined with an output based on a next input. As shown in a timing diagram 890 on the above-described signals, a threshold time 891 may be a time interval after reset until the window signal WINDOW is deactivated.

Figure 9:
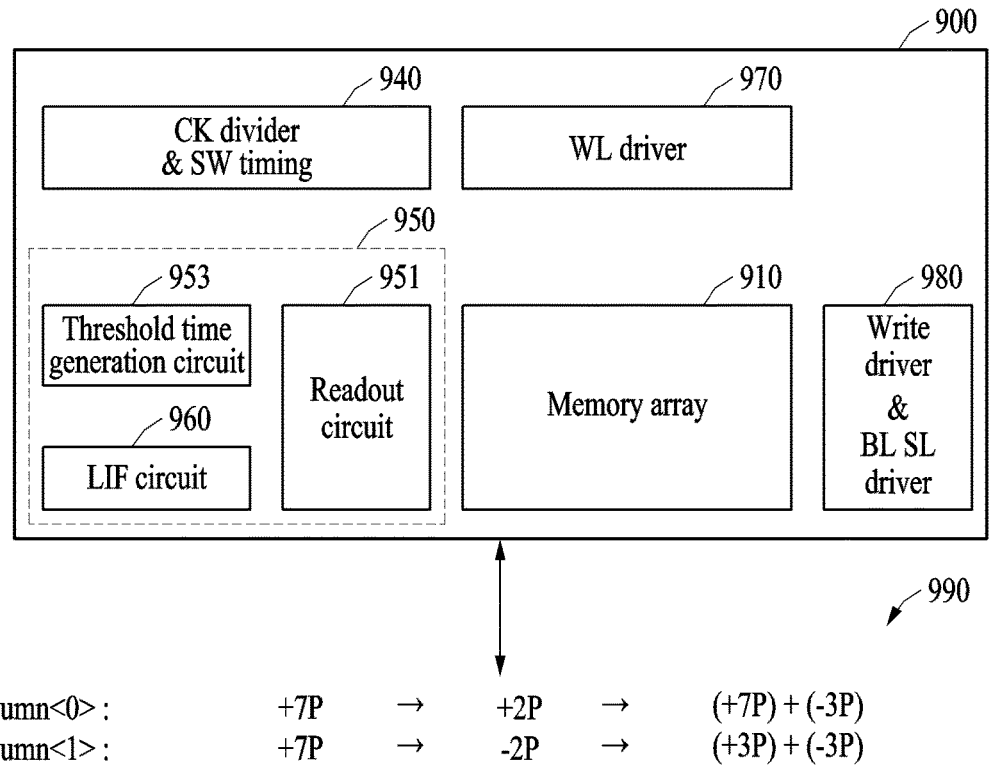
FIG. 9 illustrates an example of a firing operation of a neural network circuit, according to one or more embodiments.
Figure 9:
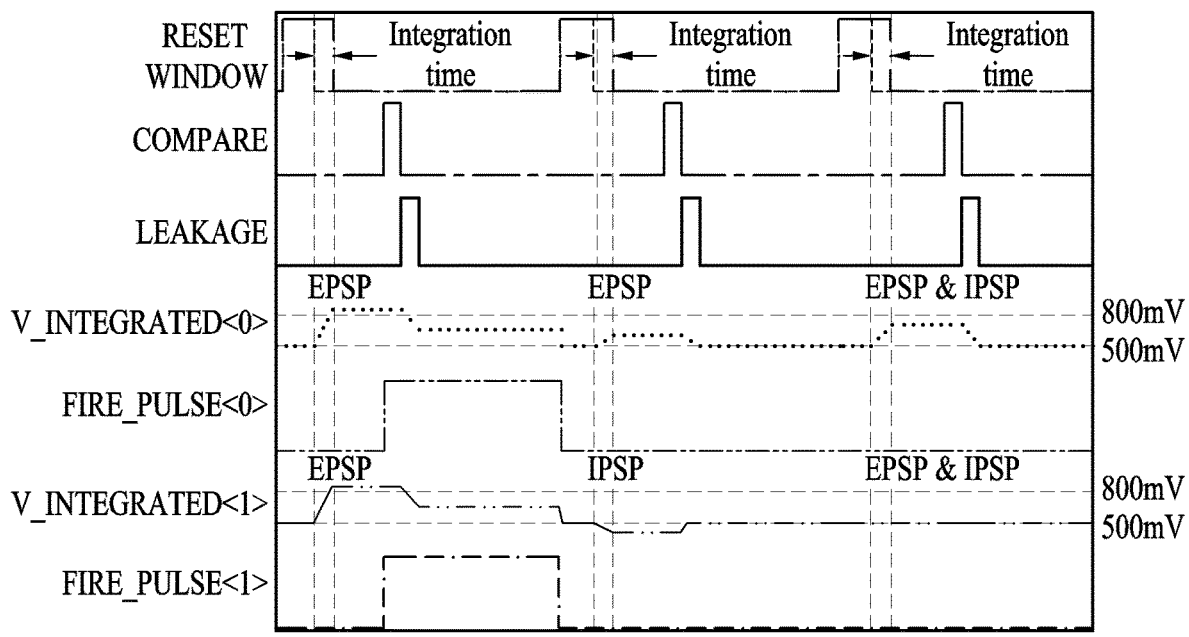

FIG. 9 illustrates an example of a firing operation of a neural network circuit, according to one or more embodiments.

The neural network circuit may include a memory array 910, an output circuit 950, a divider-and-timing generator 940, a word line driver 970, and a write driver 980. The memory array 910 may include a synaptic memory array, a reference memory array, a threshold memory array, and an additional reference memory array. The output circuit 950 may include a readout circuit 951, a threshold time generation circuit 953, and an LIF circuit 960. The memory array 910 and the output circuit 950 are described above. The divider-and-timing generator 940 may generate signals (e.g., a dock signal and a control signal for an individual element) used in a circuit. The word line driver 970 may drive a word line (e.g., an input line) of the memory array 910. The write driver 980 may set a resistance value of a resistive memory element of a memory cell disposed along a bit line of the memory array 910 and may drive the bit line and a sense line.

A timing diagram 990 in FIG. 9 illustrates an example of an operation of a neural network circuit of which threshold is set to T=6. A threshold net signal $I_{net,Th}$ may be $6(I_P-I_{AP})$. A current flowing through a column <0> may change as $7(I_P-I_{AP}) \to 2(I_P-I_{AP}) \to 7(I_P-I_{AP})+(-3)(I_P-I_{AP})$, and a current flowing through a column <1> may change as $7(I_P-I_{AP}) \to -2(I_P-I_{AP}) \to 3(I_P-I_{AP})+(-3)(I_P-I_{AP})$. As described above, when a stimulus less than or equal to a threshold is transmitted, a firing signal may not be output, and an integrated voltage V_integrated may be transmitted up to an interval in which a leakage pulse (LEAKAGE) is high. A level of the integrated voltage V_integrated may gradually decrease during the interval in which the leakage pulse is high. When a stimulus greater than or equal to the threshold is transmitted, the firing signal may be output and the integrated voltage V_integrated may be initialized. In addition, when a stimulus is further transmitted after the integrated voltage V_integrated is leaked when the stimulus less than or equal to the threshold has been transmitted, and a sum of the stimuli is greater than or equal to the threshold, the firing signal may be output. In the example illustrated in FIG. 9, as the threshold is T=6, for the current flowing through the column <0>, sequentially, firing→leakage→leakage may occur. For the current flowing through the column <1>, sequentially, firing→leakage→leakage may occur.

Figure 10:
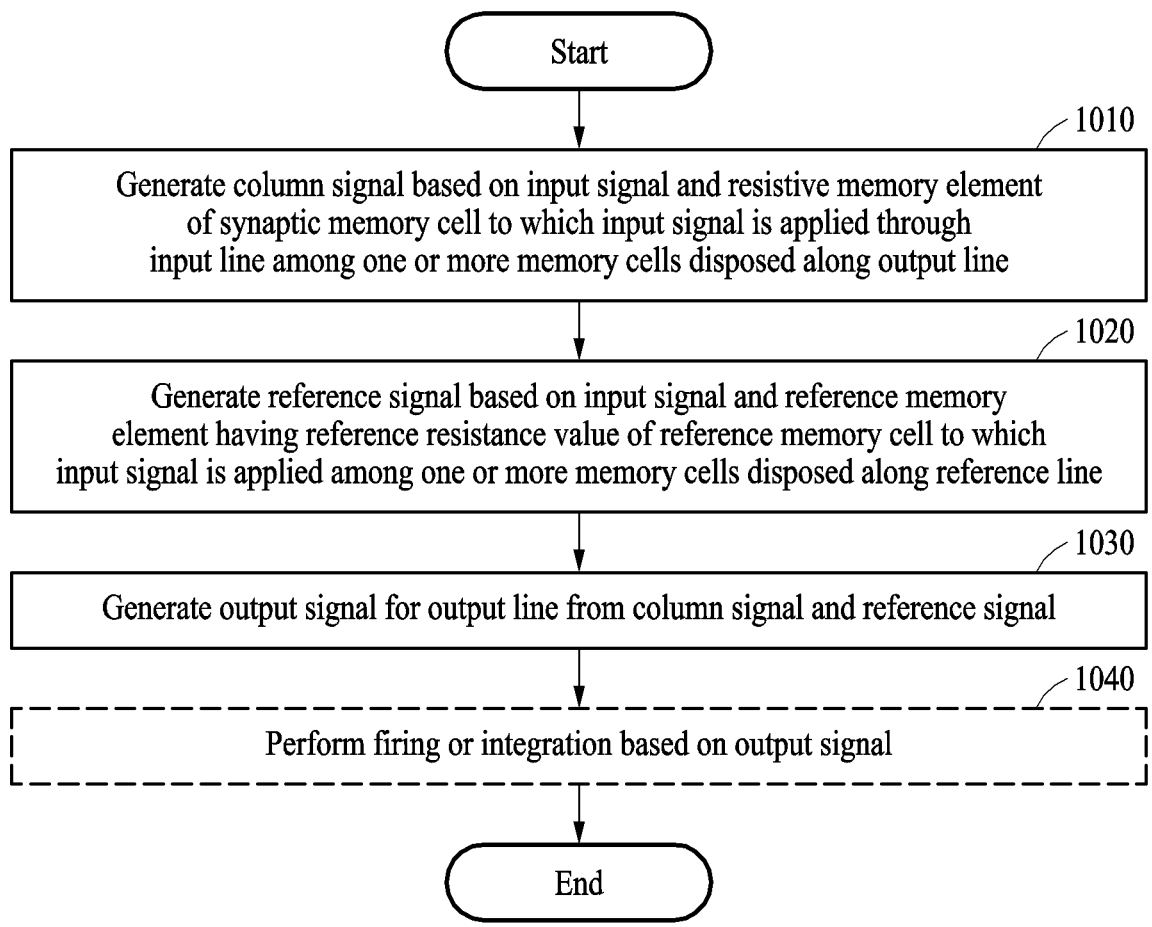
FIG. 10 illustrates an example of an operating method of a neural network circuit, according to one or more embodiments.

FIG. 10 illustrates an example of an operating method of a neural network circuit, according to one or more embodiments.

In operation 1010, the neural network circuit may generate a column signal, based on an input signal and a resistive memory element of a synaptic memory cell (to which the input signal is applied through an input line) among one or more memory cells disposed along an output line. For example, when an input signal (e.g., a spike signal) is received through a pre-synaptic circuit, the neural network circuit may access a word line of a memory array. A readout circuit of the neural network circuit may generate a column signal (e.g., a current), based on a synaptic weight and the input signal.

In operation 1020, the neural network circuit may generate a reference signal, based on the input signal and based on a reference memory element having a reference resistance value of a reference memory cell to which the input signal is applied. The reference memory cell may be among one or more memory cells disposed along a reference line. The reference resistance value may be provided by a predetermined combination of one or more of the first resistance value and/or the second resistance value, and the reference resistance value may be selected based on its applicability to a particular application. Different reference resistance values (stemming from different combinations of the first value and/or second value) may be selected for different applications.

In operation 1030, the neural network circuit may generate an output signal for the output line from the column signal and the reference signal. The neural network circuit, to offset a current in a high resistance state, may generate an output signal corresponding to a difference between a column integrated signal and a reference integrated signal.

In operation 1040, the neural network circuit may perform firing or integration based on the output signal. For example, the neural network circuit may leak the output signal (as a voltage) for a threshold time. The neural network circuit may perform firing or integration based on a result of comparing the leaked output voltage with a threshold voltage. When the output voltage exceeds the threshold voltage, the neural network circuit may perform firing. When the output voltage is less than or equal to the threshold voltage, the neural network circuit may perform integration and maintain the output voltage until a next neuron input is provided.

Processing of an output signal of a neural network is not limited to the foregoing operation 1040. The output circuit of the neural network circuit may obtain a MAC value between a synaptic weight and an input signal received along the input line, based on a result (e.g., an analog-digital converted value) obtained by interpreting the output signal, and the output circuit may transmit a node value (e.g., an activation value) determined based on the obtained value of the MAC to another neuron circuit.

The computing apparatuses, the electronic devices, the processors, the memories, the storage devices, and other apparatuses, devices, units, modules, and components described herein with respect to FIGS. 1-10 are implemented by or representative of hardware components. Examples of hardware components that may be used to perform the operations described in this application where appropriate include controllers, sensors, generators, drivers, memories, comparators, arithmetic logic units, adders, subtracters, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity; the singular term "processor" or "computer" may be used in the description of the examples described in this application, but in other examples multiple processors or computers may be used, or a processor or computer may include multiple processing elements; or multiple types of processing elements, or both. For example, a single hardware component or two or more hardware components may be implemented by a single processor, or two or more processors, or a processor and a controller. One or more hardware components may be implemented by one or more processors; or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors; single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-10 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD-Rs, CD-RWs, CD+RWs, DVD-ROMs, DVD-Rs, DVD+Rs, DVD-RVUs, DVD+RWs, DVD-RAMS; BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A neural network circuit comprising:
a plurality of synaptic memory cells, disposed along a first output line, configured to generate a column signal based on resistive memory elements and an input comprised of concurrent input signals being received through respective input lines, each of the synaptic memory cells comprising a resistive memory element having a resistive value that is settable to a first resistance value and is settable to a second resistance value, the column signal having a column value that depends on the resistance values of the synaptic memory as applied to the respective input signals of the input; and
a plurality of reference memory cells, disposed along a reference line and sharing the input lines with the synaptic memory cells respectively, and configured to generate a reference signal based on reference memory elements and the input's input signals, each of the reference memory cells comprising a reference memory element having the second resistance value different from the first resistance value, the reference signal having a reference value that depends on the resistance values of the respective reference memory elements as applied to the respective input signals of the input; and
an output circuit configured to generate an output signal, for the first output line, indicating an amount of difference between the column value and the reference value, the output signal corresponding to an operation between the synaptic memory cells and the input signals as determined according to the reference signal.

2. The neural network circuit of claim 1, wherein
a number of the plurality of reference memory cells along the reference line is identical to a number of the plurality of synaptic memory cells.

3. The neural network circuit of claim 1,
wherein each of the plurality of synaptic memory cells comprises a number of resistive memory elements corresponding to a number of bits for expressing a synaptic weight assigned to the each of the plurality of synaptic memory cells, and
wherein the number of resistive memory elements corresponding to the number of bits are disposed along the input line.

4. The neural network circuit of claim 3,
wherein each of the plurality of synaptic reference memory cells comprises a number of reference memory elements corresponding to the number of bits for expressing the synaptic weight, and
wherein the reference memory elements corresponding to the number of bits are disposed along the input line.

5. The neural network circuit of claim 3, wherein
each of the plurality of synaptic reference memory cells comprises:
reference memory elements for expressing a sign bit.

6. The neural network circuit of claim 1, wherein
the output circuit is further configured to:
generate, as the output signal, a current corresponding to a positive integer multiple of a net current, which is a difference between a first current based on a resistive memory element having the first resistance value and a second current based on a resistive memory element having the second resistance value.

7. The neural network circuit of claim 1, wherein
the output circuit is further configured to:
generate, as the output signal, a current corresponding to a negative integer multiple of a net current, which is a difference between a first current based on a resistive memory element having the first resistance value and a second current based on a resistive memory element having the second resistance value.

8. The neural network circuit of claim 7, wherein the neural network circuit comprises a neuron circuit comprising the synaptic memory cell, the reference memory cell, and the output circuit, and wherein
the output circuit further comprises:
a leaky integrate-and-fire (LIF) circuit configured to perform firing at another neuron circuit, based on a result of comparing the output signal with a threshold.

9. The neural network circuit of claim 8, wherein
the LIF circuit is further configured to:
increase an output voltage when the output signal corresponds to the positive integer multiple of a net current.

10. The neural network circuit of claim 9, wherein
the LIF circuit is further configured to:
decrease an output voltage when the output signal corresponds to the negative integer multiple of a net current.

11. The neural network circuit of claim 1, wherein the output circuit comprises an analog-to-digital converter configured to convert the output signal from an analog signal to a digital value.

12. The neural network circuit of claim 8, further comprising:
a plurality of threshold memory cells, each of the plurality of threshold memory cells comprising a plurality of memory elements, wherein at least one memory element thereof, designated among the plurality of memory elements based on the threshold, has the first resistance value.

13. The neural network circuit of claim 12, further comprising:
a plurality of additional reference memory cells, disposed along the reference word line, configured to share a reference word line with the threshold memory array, and wherein each of the plurality of additional reference memory cells comprises an additional reference memory element having the second resistance value.

14. The neural network circuit of claim 13, wherein the output circuit is further configured to:
  set a threshold time corresponding to the threshold, based on a signal generated based on the plurality of threshold memory cells and a signal generated based on the plurality of additional reference memory cells.

15. The neural network circuit of claim 14, wherein the output circuit is further configured to:
  initiate an integration of a current corresponding to a difference between the signal generated based on the plurality of threshold memory cells and the signal generated based on the plurality of additional reference memory cells and output a signal indicating a threshold time corresponding to the threshold, wherein the initiating is based on a voltage corresponding to the integrated current exceeding a threshold voltage.

16. The neural network circuit of claim 14, wherein the output circuit is further configured to:
  apply, to the output signal for the first output line and to another output signal for another output line, a threshold time corresponding to the threshold determined based on the plurality of threshold memory cells and the plurality of additional reference memory cells.

17. The neural network circuit of claim 1, wherein resistive memory elements of the plurality of synaptic memory cells connected to the first output line are connected to each other in parallel.

18. The neural network circuit of claim 1, further comprising:
  a plurality of other synaptic memory cells disposed along another output line other than the first output line, and wherein the output circuit is further configured to:
  individually generate output signals for each of the first output line and the other output line by using the same reference memory cell.

19. The neural network circuit of claim 1, wherein each of the plurality of synaptic memory cells comprises bits comprising respective resistors, wherein
  each of the plurality of the reference memory cells comprises bits comprising respective resistors, and wherein the output circuit comprises:
  a readout circuit configured to generate a column integrated signal by integrating column bit signals for bits of the synaptic memory cell as the column signal and generate a reference integrated signal by integrating reference bit signals for bits of the reference memory cell as the reference signal.

20. The neural network circuit of claim 19, wherein the readout circuit comprises:
  a current mirror configured to copy the column signal for each bit of the plurality of synaptic memory cells and the plurality of reference memory cells to a current-multiple corresponding to the bit.

21. The neural network circuit of claim 19, wherein the output signal indicates a difference between the column integrated signal and the reference integrated signal.

22. The neural network circuit of claim 21, wherein the output circuit further comprises:
  a capacitor configured to allow a current corresponding to the reference integrated signal to flow in a node and allow a current corresponding to the column integrated signal to flow out from the node such that a current indicating the difference between the column integrated signal and the reference integrated signal flows through the node, wherein the node comprises the neural network circuit.

23. The neural network circuit of claim 1, wherein the neural network circuit comprises a neuron circuit comprising the synaptic memory cell, the reference memory cell, and the output circuit, and wherein
  the output circuit is further configured to:
  obtain, based on a result obtained by interpreting the output signal, a multiply-and-accumulate (MAC) value between a synaptic weight and an input signal received along the input line, and
  transmit a node value determined based on the obtained MAC value to another neuron circuit.

24. The neural network circuit of claim 1, wherein a ratio is predetermined based on an application.

25. An operating method of a neural network circuit comprising columns configured to store values and rows of the columns configured to receive an input of concurrent input signals via a plurality of input lines, the input lines respectively corresponding to the rows, the operating method comprising:
  generating a column signal for at least a column among the columns, based on the input signals and resistance values of respective resistive memory elements of synaptic memory cells of the column to which the input signals are applied through the respect input lines, wherein the synaptic memory cells of the column are disposed along an output line, wherein the column signal has a column value that depends on resistance values of the respective resistive memory elements of the column as applied to the respective input signals of the input;
  generating a reference signal, based on the input signals and reference memory elements of a reference column, the reference memory elements having reference resistance values of respective reference memory cells to which the input signals are respectively applied, wherein the reference memory cells are disposed along a reference line sharing the input lines with the synaptic memory cells respectively, wherein the reference signal has a reference value that depends the reference resistance values as applied to the respective input signals; and
  generating an output signal for the first output line, where a value of the output signal is based on an amount of difference between the column signal and the reference signal, the output signal corresponding to an operation between the synaptic memory cells and the input signals as determined according to the reference signal,
  wherein the reference resistance value is determined based on a combination of a first resistance value and a second resistance value that is different from the first resistance value.

26. The operating method of claim 25, wherein the combination is predetermined based on an application.

27. A processor comprising:
  a memory array comprising rows and columns of resistive memory cells comprising respective resistors, wherein each resistive memory cell of the memory array has a resistance that is programmable to vary between a first resistance and a second resistance, wherein a column of the memory array provides a column current based on concurrent input signals of an input supplied to respective resistive memory elements of the column and based on the resistances of the respective memory elements of the column, the column current having a value that depends on the resistances of the respective resistors of the memory array as applied to the respective concurrent input signals of the input;

a reference array of resistive memory cells comprising respective resistors, wherein each resistive memory cell of a reference column has a resistance that is programmable to vary between the first resistance and the second resistance, wherein the reference memory array provides a reference current based on the concurrent input signals of the input being supplied to resistive memory elements of the reference array and based on the resistances of the respective memory elements of the reference array, the reference current having a value that depends on the resistances of the respective resistors of the reference array as applied to the respective concurrent input signals of the input; and an output circuit configured to generate an output current based on an amount of difference between the column current value and the reference current value, the output current corresponding to a result of an operation between the resistive memory cells and the input signals of the input.

28. The processor of claim 27, wherein the memory cells of the memory array are configured to store respective synaptic weights and wherein the reference array are not configured to store synaptic weights.

29. The processor of claim 27, wherein the output circuit configured to determine whether to output a firing signal based on an integrated column current and the integrated reference current.

30. The processor of claim 29, wherein the determining whether to output a firing signal is based on a current difference between the column current and the reference current.

31. The processor of claim 30, wherein the processor is to convert the current difference to a voltage and determine whether to output the firing signal by comparing the voltage to a threshold voltage.

32. The processor of claim 29, further comprising:

a threshold column comprising resistive memory cells comprising respective resistors each programmable to vary between having the first resistance value and the second resistance value; and a second reference column comprising resistive memory cells comprising respective resistors each programmable to vary between having the first resistance value and the second resistance value; and wherein the determining whether to output a firing signal is further based on a current of the threshold column and a current of the second reference column.

33. The processor of claim 32, wherein the determining whether to output a firing signal is further based on a current difference between the current of the second reference column and the current of the threshold column.

34. The processor of claim 33, wherein determining whether to output a firing signal comprises determining a threshold voltage based on the current difference between the current of the second reference column the current of the second reference column and comparing the threshold voltage to a voltage based on the current difference between the current of the column of the crossbar array and the current of the reference array.

35. The processor of claim 27, wherein the column current corresponds to a linear combination of the first resistance and the second resistance as stored in the resistors of the column, and wherein the current of the reference column corresponds to a linear combination of the first resistance and the second resistance as stored in the resistors of the reference array.

* * * * *